United States Patent
Sato et al.

(10) Patent No.: US 11,264,417 B2
(45) Date of Patent: Mar. 1, 2022

(54) PHOTO DETECTION ELEMENT, OPTICAL SENSOR, AND METHOD OF MANUFACTURING PHOTO DETECTION ELEMENT

(71) Applicant: FUJITSU LIMITED, Kawasaki (JP)

(72) Inventors: Shintaro Sato, Atsugi (JP); Hironori Nishino, Isehara (JP); Daiyu Kondo, Atsugi (JP); Kenjiro Hayashi, Hadano (JP)

(73) Assignee: FUJITSU LIMITED, Kawasaki (JP)

( * ) Notice: Subject to any disclaimer, the term of this patent is extended or adjusted under 35 U.S.C. 154(b) by 382 days.

(21) Appl. No.: 16/587,095

(22) Filed: Sep. 30, 2019

(65) Prior Publication Data

US 2020/0152679 A1    May 14, 2020

(30) Foreign Application Priority Data

Nov. 8, 2018 (JP) .............. JP2018-210627

(51) Int. Cl.
*H01L 27/146* (2006.01)
*H01L 31/102* (2006.01)
*H01L 31/0224* (2006.01)
*H01L 29/16* (2006.01)

(52) U.S. Cl.
CPC ...... *H01L 27/14612* (2013.01); *H01L 31/102* (2013.01); *H01L 29/1606* (2013.01); *H01L 31/0224* (2013.01)

(58) Field of Classification Search
CPC ............. H01L 27/14612; H01L 31/102; H01L 29/1606; H01L 31/0224; H01L 27/14609; H01L 27/14625; H01L 31/028; H01L 31/036; H01L 31/09; H01L 27/1446; B82Y 10/00; B82Y 15/00
See application file for complete search history.

(56) References Cited

U.S. PATENT DOCUMENTS

| | | | |
|---|---|---|---|
| 9,614,110 B2* | 4/2017 | Kim | ...... H01L 31/101 |
| 10,079,313 B2* | 9/2018 | Lee | ...... H01L 21/02527 |
| 2011/0042650 A1 | 2/2011 | Avouris et al. | |
| 2018/0006067 A1 | 1/2018 | Ogawa et al. | |

FOREIGN PATENT DOCUMENTS

| | | |
|---|---|---|
| JP | 2013-502735 A | 1/2013 |
| JP | 2018-037617 A | 3/2018 |
| WO | 2016121408 A1 | 8/2016 |

OTHER PUBLICATIONS

Xinghan Cai et al., "Sensitive Room-Temperature Terahertz Detection Via the Photothermoelectric Effect in Graphene", Nature Nanotechnology (Published online on Sep. 7, 2014) vol. 9, Oct. 2014, p. 814-819 (6 pages).

* cited by examiner

*Primary Examiner* — Seung C Sohn
(74) *Attorney, Agent, or Firm* — Fujitsu Patent Center

(57) ABSTRACT

A photo detection element includes: a substrate; a light-receiving layer formed over the substrate, the light-receiving layer including graphene layers that are stacked such that lattices of the graphene layers are randomly displaced from each other in plan view; a first electrode that is in contact with the light-receiving layer; and a second electrode that is in contact with the light-receiving layer, a material of the second electrode differing from a material of the first electrode.

18 Claims, 34 Drawing Sheets

GRAPHENE

PHOTO DETECTION ELEMENT, OPTICAL SENSOR, AND METHOD OF MANUFACTURING PHOTO DETECTION ELEMENT

CROSS-REFERENCE TO RELATED APPLICATION

This application is based upon and claims the benefit of priority of the prior Japanese Patent Application No. 2018-210627 filed on Nov. 8, 2018, the entire contents of which are incorporated herein by reference.

FIELD

A certain aspect of the embodiments is related to a photo detection element, an optical sensor, and a method of manufacturing a photo detection element.

BACKGROUND

Photo detection elements are roughly classified into two types based on their principles. A first photo detection element is an element in which a semiconductor layer is used as a light-receiving layer. In particular, the photo detection element including a semiconductor layer having a small band gap has sensitivity in the infrared region, is highly sensitive, and has high-speed responsivity. However, in this type of photo detection element, the semiconductor layer needs to be cooled to reduce noise.

A second photo detection element is an element that detects a change in the temperature of a thin film irradiated with a light, and is also referred to as a bolometer or a thermal element. This type of photo detection element detects a light based on a change in the temperature of the thin film. Thus, the thin film does not need to be cooled, and the photo detection element can operate at room temperature. However, this type of photo detection element is inferior to the aforementioned photo detection element using a semiconductor layer in terms of sensitivity and response speed.

A photo detection element that uses the photo-thermoelectric effect of graphene to detect a light is also reported. This photo detection element allows detection of lights in the near infrared region and the terahertz region at a response speed of 1 nanosecond or less under room temperature. However, the photo detection element using graphene has a sensitivity of only approximately 10 V/W even in the terahertz region where the sensitivity is the highest.

SUMMARY

According to an aspect of the embodiments, there is provided a photo detection element including: a substrate; a light-receiving layer formed over the substrate, the light-receiving layer including graphene layers that are stacked such that lattices of the graphene layers are randomly displaced from each other in plan view; a first electrode that is in contact with the light-receiving layer; and a second electrode that is in contact with the light-receiving layer, a material of the second electrode differing from a material of the first electrode.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
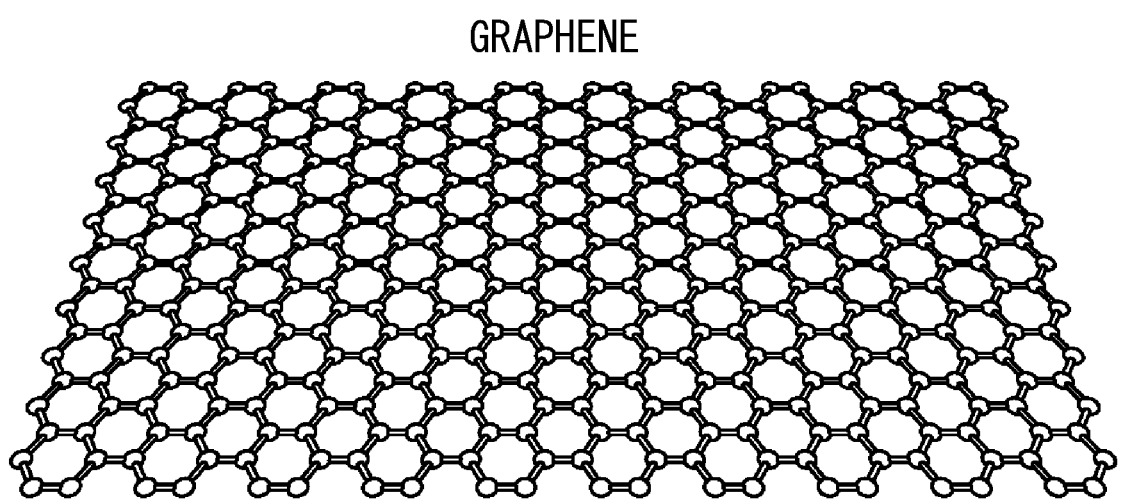
FIG. 1 is a perspective view schematically illustrating the molecular structure of graphene used in a photo detection element.

Research conducted by the inventors of the present application will be described. FIG. 1 is a perspective view schematically illustrating the molecular structure of graphene used in a photo detection element. As illustrated in FIG. 1, graphene is a substance composed of a monoatomic layer in which carbon atoms are positioned in vertices of hexagonal cells.

Figure 2C:
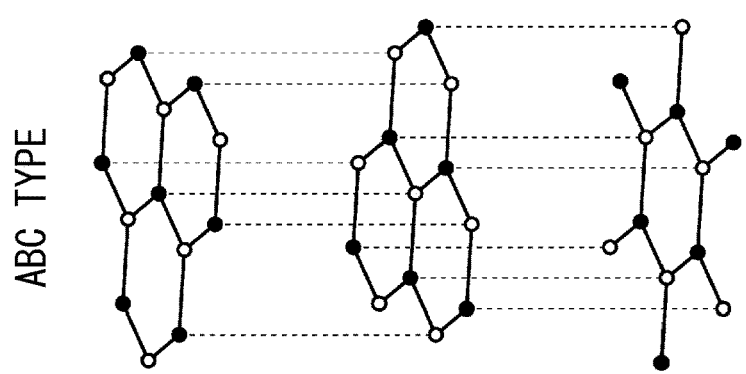
FIG. 2A through FIG. 2C illustrate crystal structures of graphite.
Figure 2B:
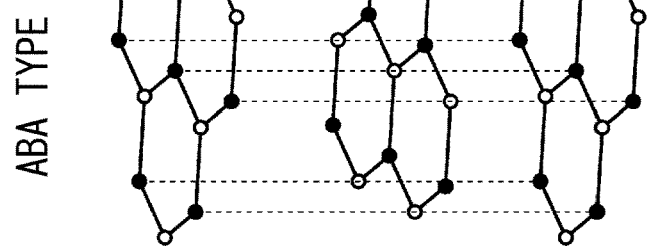
Figure 2A:
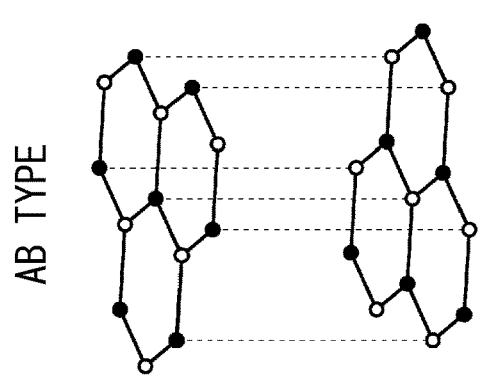

As described above, the photo detection element using the photo-thermoelectric effect of graphene to detect a light has a low sensitivity such as approximately 10 V/W. This is considered because the light absorptivity of graphene is low. The light absorptivity of graphene is only approximately 2.3% regardless of wavelengths. Thus, the remaining 97% or more of the light is discarded. Furthermore, since this photo detection element detects a light only with a single graphene layer, it is impossible to improve the sensitivity. It may be considered that multiple graphene layers are stacked and the photo-thermoelectric effect of graphene of each layer is used to improve the sensitivity. However, when multiple graphene layers are simply stacked, graphite, which has a band structure different from that of graphene, is obtained. Graphite has crystal structures in which multiple graphene layers are stacked so as to have a spatial symmetry. There are various types of crystal structures of graphite. FIG. 2A through FIG. 2C illustrate crystal structures of graphite.

FIG. 2A illustrates an AB type crystal structure of graphite, and FIG. 2B illustrates an ABA type crystal structure of graphite. FIG. 2C illustrates an ABC type crystal structure of graphite. In FIG. 2A through FIG. 2C, black circles represent carbon atoms in the A sites, and open circles represent carbon atoms in the B sites.

Any graphite illustrated in FIG. 2A through FIG. 2C has a spatial symmetry in which lattice points of graphene of one graphene layer are aligned with lattice points of graphene of another graphene layer in plan view.

Figure 3A:
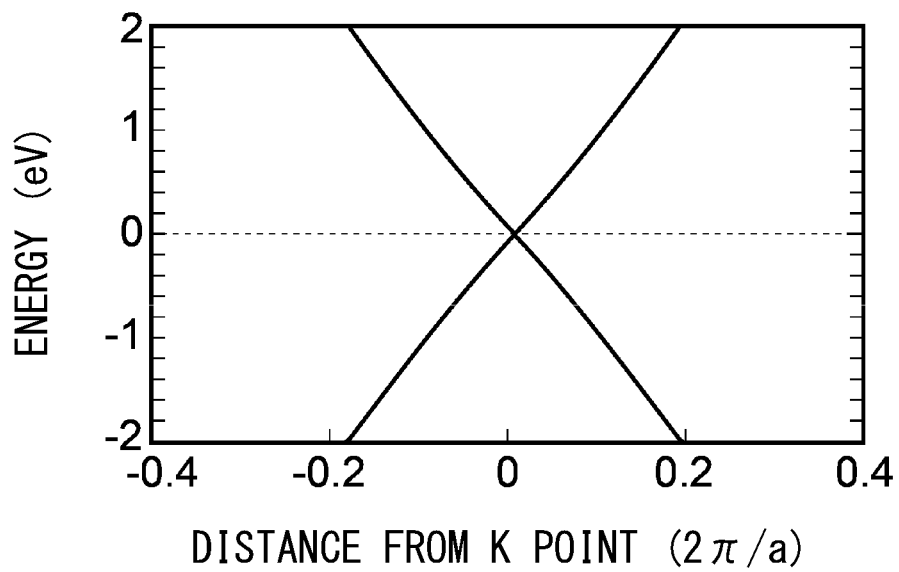
FIG. 3A illustrates the band structure of graphene.
Figure 3B:
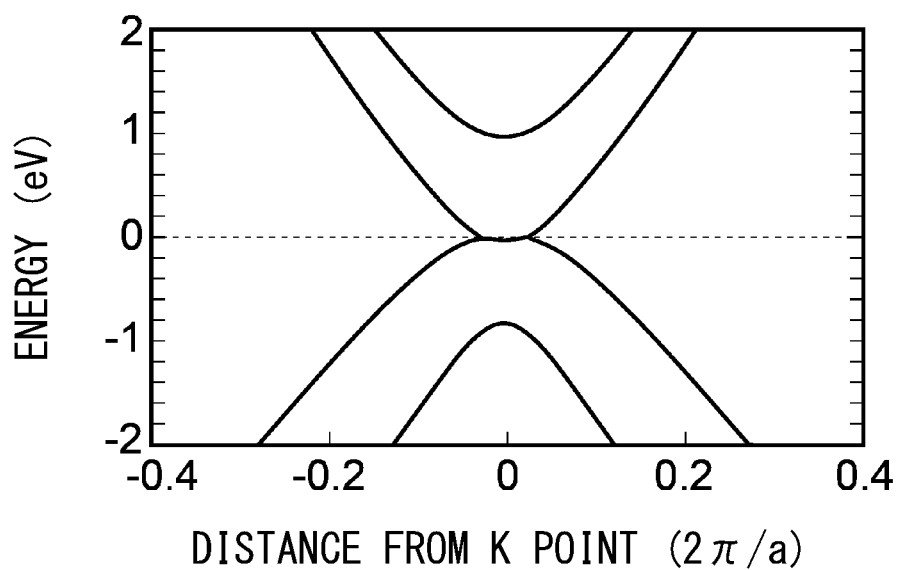
FIG. 3B illustrates the band structure of graphite.

FIG. 3A illustrates the band structure of graphene, and FIG. 3B illustrates the band structure of graphite. In FIG. 3A and FIG. 3B, the horizontal axis represents a distance from the K point in the reciprocal lattice space when "a" represents the lattice length of graphene (0.249 nm). The vertical axis represents the energy of electron (eV).

As illustrated in FIG. 3A, the band curve of graphene is linear around the K point of the reciprocal lattice space. This leads to the characteristics of graphene that the light absorptivity does not depend on the wavelength and the electron mobility around the K point is high.

On the other hand, as illustrated in FIG. 3B, for graphite, the slope of the band curve is 0 around the K point. This results in decrease in the electron mobility around the K point. In addition, since the band curve is not linear, the light absorptivity of graphite changes according to the wavelength of a light.

Thus, to achieve high sensitivity of the photo detection element while taking advantage of the characteristics of graphene such as high electron mobility and wavelength-independent light absorptivity, graphene layers are preferably stacked while the graphene layers are inhibited from forming graphite. Hereinafter, embodiments will be described.

First Embodiment

Figure 4A:
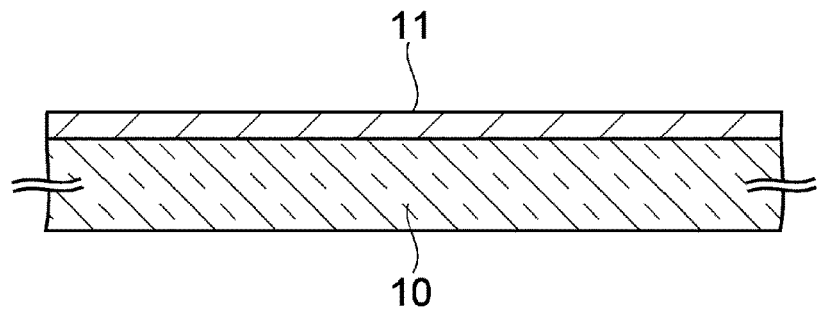
FIG. 4A through FIG. 4C are cross-sectional views (No. 1) of a photo detection element in accordance with a first embodiment in the process of production.

A photo detection element in accordance with a first embodiment will be described by following the manufacturing process thereof. The photo detection element is an element using the photo-thermoelectric effect of graphene to detect a light, and is manufactured as follows. FIG. 4A through FIG. 11B are cross-sectional views of the photo detection element in accordance with the first embodiment in the process of production. As illustrated in FIG. 4A, prepared is a silicon substrate 10 having a silicon oxide layer 11 with a thickness of 50 nm to 1000 nm formed on the surface thereof.

Figure 4B:
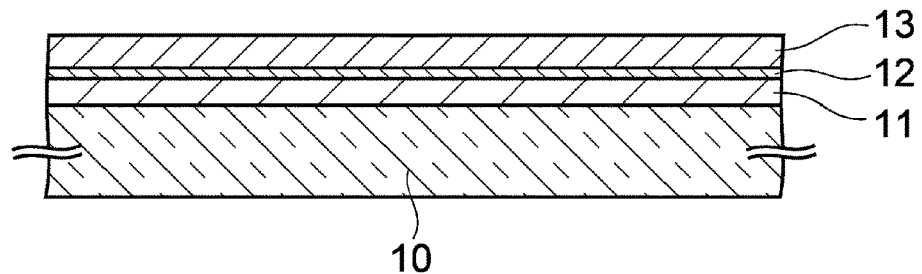

Then, as illustrated in FIG. 4B, an underlying metal layer 12 and a catalytic metal layer 13 are formed on the silicon oxide layer 11 in this order by sputtering. The materials and film thicknesses of these layers are not particularly limited. In the first embodiment, a titanium nitride layer is formed, as the underlying metal layer 12, to a thickness of approximately 0.1 nm to 50 nm, for example, approximately 5 nm. Then, a cobalt layer is formed, as the catalytic metal layer 13, to a thickness of approximately 2 nm to 200 nm, for example, approximately 20 nm. Next, the step illustrated in FIG. 4C will be described.

Figure 12:
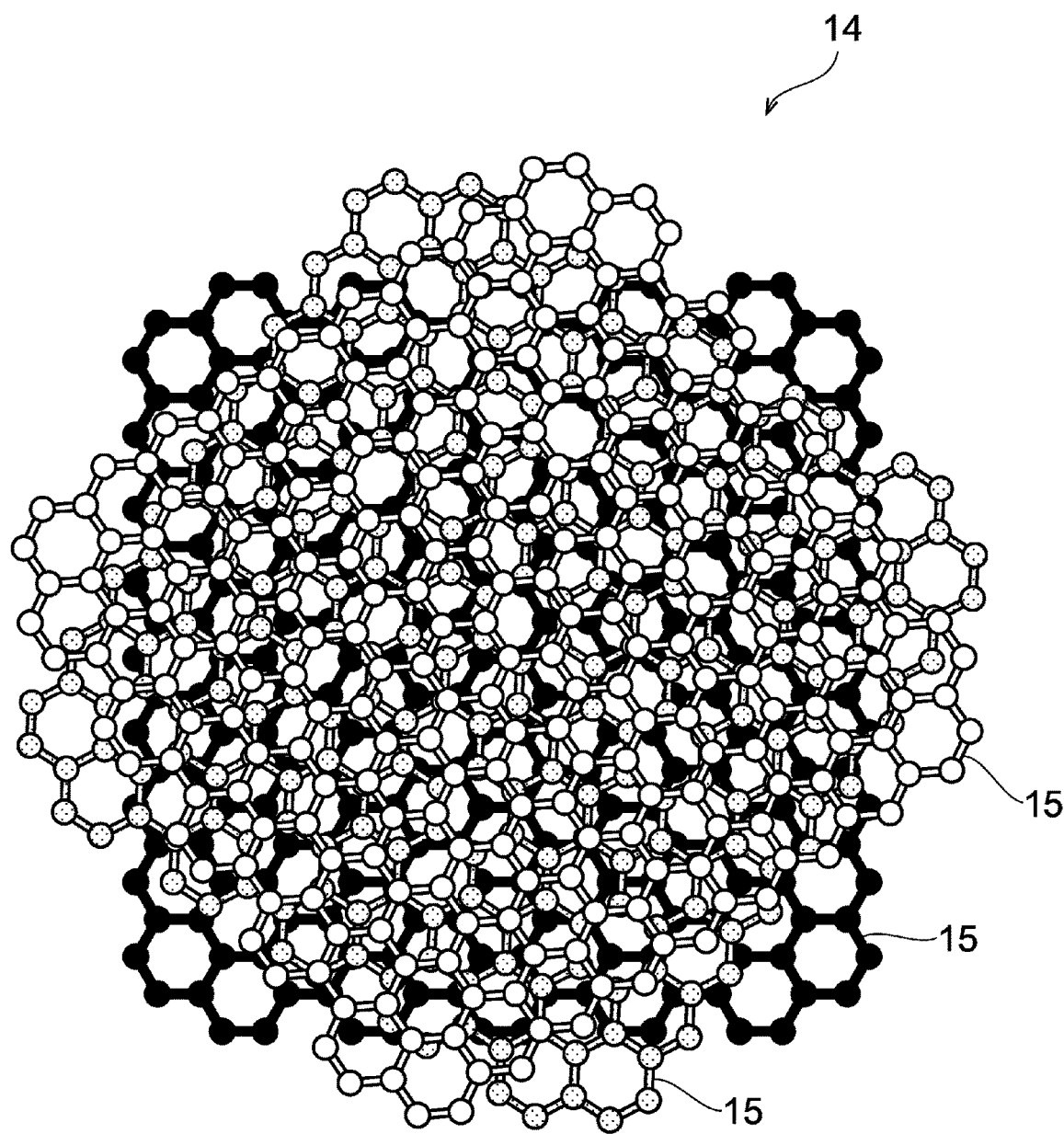
FIG. 12 is a plan view of several graphene layers in accordance with the first embodiment.

First, the silicon substrate 10 is placed in a thermal chemical vapor deposition (CVD) furnace (not illustrated), and the substrate temperature is made to be approximately 510° C. Then, in this state, the pressure inside the furnace is maintained at 1 kPa while a reaction gas obtained by diluting acetylene gas with argon is supplied to the furnace at a flow rate of 200 sccm. The concentration of the acetylene gas in the reaction gas is 10%. Then, the above state is maintained for 50 minutes to obtain a light-receiving layer 14 formed of approximately 100 graphene layers 15 that are stacked. The number of the graphene layers 15 that are stacked is not limited to 100, and 5 to 500 graphene layers 15 may be stacked by varying the reaction time or the acetylene concentration. FIG. 12 is a plan view of several graphene layers 15 formed in the above-described manner.

As illustrated in FIG. 12, the graphene layers 15 are formed such that the lattices of the graphene layers 15 are randomly displaced from each other in plan view. This structure inhibits the graphene layers 15 from forming graphite and forming the crystal structures illustrated in FIG. 2A through 2C, and makes the electronic state of the light-receiving layer 14 identical to the electronic state of graphene.

Figure 5A:
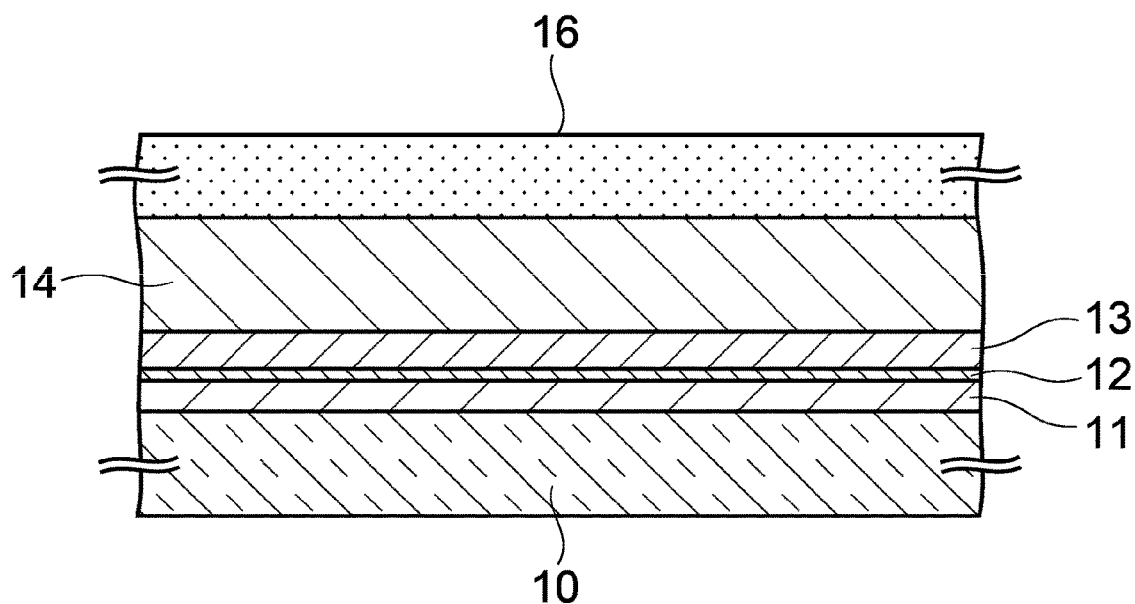
FIG. 5A and FIG. 5B are cross-sectional views (No. 2) of the photo detection element in accordance with the first embodiment in the process of production.

Next, as illustrated in FIG. 5A, a polymer such as polymethyl methacrylate (PMMA) is applied to a thickness of approximately 0.1 µm to 100 µm onto the light-receiving layer 14 by spin coating. The polymer coating film is referred to as a first supporting layer 16. Instead of a polymer, a resist coating film may be formed as the first supporting layer 16.

Figure 5B:
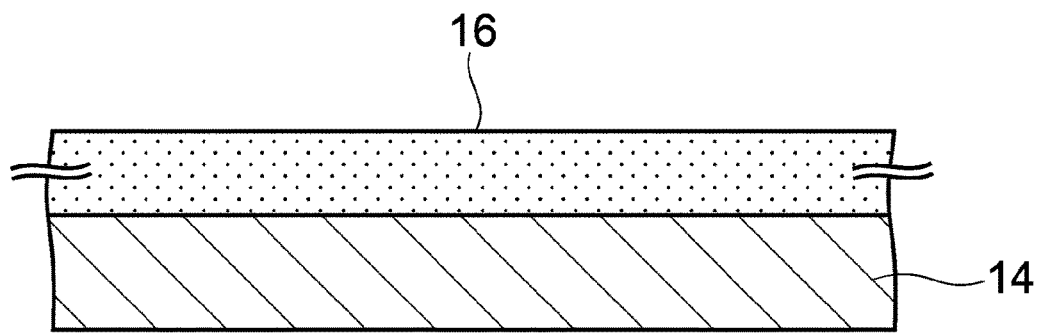

Thereafter, the first supporting layer 16 is heated to remove the solvent component in the film. The heating temperature at this time is, for example, a room temperature to approximately 200° C. depending on the material of the first supporting layer 16. Then, as illustrated in FIG. 5B, the catalytic metal layer 13 is dissolved and removed from the sides with, for example, a ferric chloride solution. As a result, the structure in which the light-receiving layer 14 is formed on the surface of the first supporting layer 16 is obtained. Next, the step illustrated in FIG. 6A will be described.

A sapphire substrate 17 is prepared separately from the above-described steps illustrated in FIG. 4A to FIG. 5B. An iron layer is formed, as a catalytic metal layer 18, to a thickness of 20 nm to 5000 nm, for example, approximately 100 nm on the sapphire substrate 17 by sputtering.

Figure 6A:
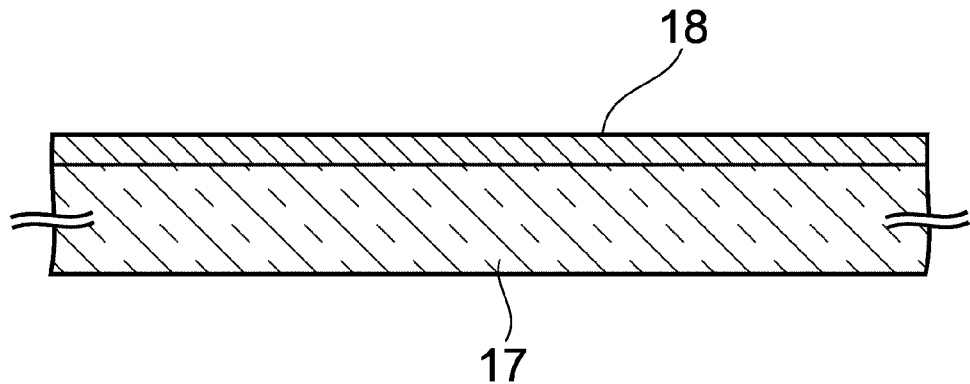
FIG. 6A and FIG. 6B are cross-sectional views (No. 3) of the photo detection element in accordance with the first embodiment in the process of production.
Figure 6B:
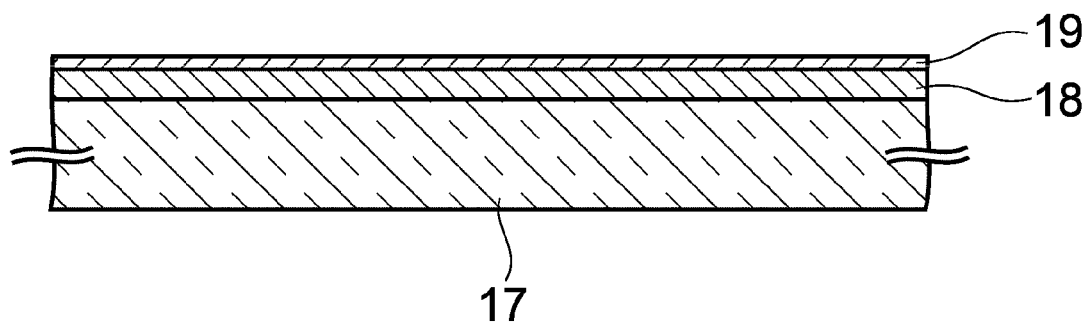

Then, as illustrated in FIG. 6B, the sapphire substrate 17 is placed in a thermal CVD furnace (not illustrated), and a mixed gas of ammonia, diborane, hydrogen, and argon is supplied to the furnace while the substrate temperature is maintained at approximately 1050° C. Then, this state is maintained for approximately 30 minutes to cause a hexagonal boron nitride (hBN) layer 19 to grow to a thickness of the thickness of a monoatomic layer (0.34 nm) to 100 nm, for example, approximately 3 nm on the catalytic metal layer 18 by the catalytic action of the catalytic metal layer 18.

Figure 7A:
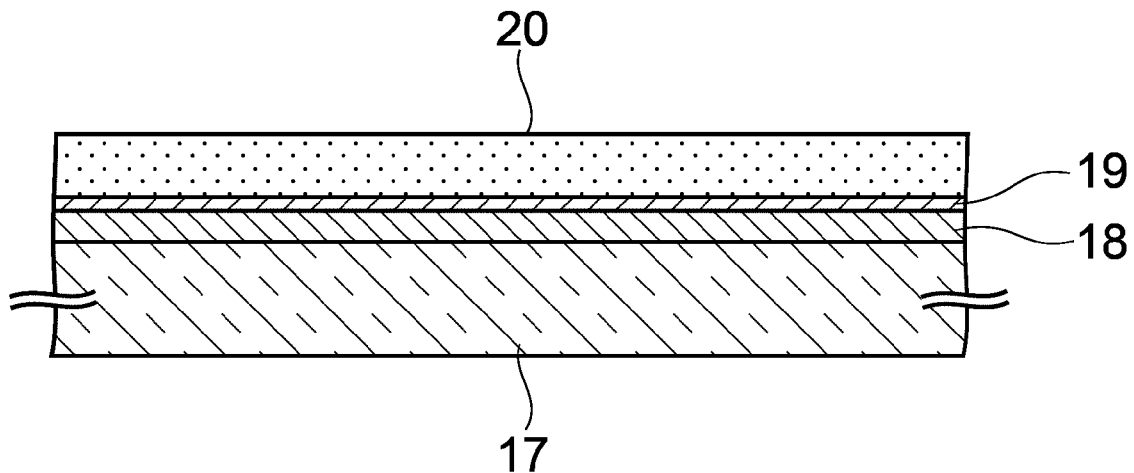
FIG. 7A and FIG. 7B are cross-sectional views (No. 4) of the photo detection element in accordance with the first embodiment in the process of production.

Then, as illustrated in FIG. 7A, a polymer such as PMMA is applied to a thickness of approximately 0.1 µm to 100 µm on the hexagonal boron nitride layer 19 by spin coating. The polymer coating film is referred to as a second supporting layer 20. As with the first supporting layer 16, a resist coating film may be formed as the second supporting layer 20. Thereafter, the second supporting layer 20 is heated to a temperature of a room temperature to approximately 200° C. to remove the solvent component in the film.

Figure 7B:
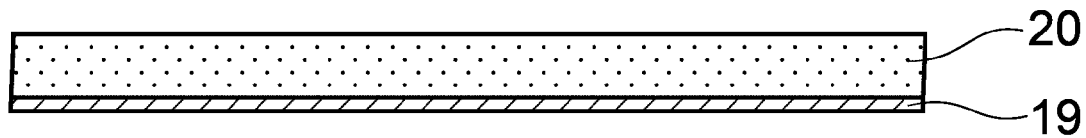

Then, as illustrated in FIG. 7B, the catalytic metal layer 18 is etched and removed from the sides by immersing the sapphire substrate 17 in an etching liquid. As a result, the structure in which the hexagonal boron nitride layer 19 is formed on the surface of the second supporting layer 20 is obtained. The etching liquid for this process is not particularly limited, but an iron (III) chloride ($FeCl_3$) solution, which does not generate bubbles at the time of etching, is preferably used.

In this embodiment, the hexagonal boron nitride layer 19 is formed on the catalytic metal layer 18, but the hexagonal boron nitride layer 19 may be formed on the surface of a catalytic metal foil. In this case, the hexagonal boron nitride layer 19 is formed on both surfaces of the catalytic metal foil. Thus, the hexagonal boron nitride layer 19 may disturb wet etching of the catalytic metal foil. Thus, in this case, the hexagonal boron nitride layer 19 on one of the surfaces of the catalytic metal foil is preferably mechanically scraped off with a file or the like. The hexagonal boron nitride layer 19 may be removed by oxygen plasma or argon plasma. After the second supporting layer 20 is formed on the hexagonal boron nitride layer 19 remaining on the other of the surfaces of the catalytic metal foil, the catalytic metal foil is made afloat on an etching liquid with the second supporting layer 20 up to etch the catalytic metal foil from below. Through this process, a structure identical to the structure illustrated in FIG. 7B is obtained.

Figure 8A:
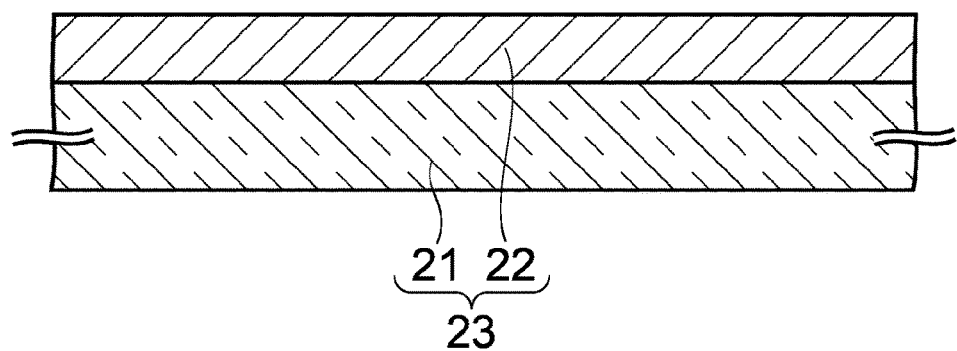
FIG. 8A and FIG. 8B are cross-sectional views (No. 5) of the photo detection element in accordance with the first embodiment in the process of production.
Figure 8B:
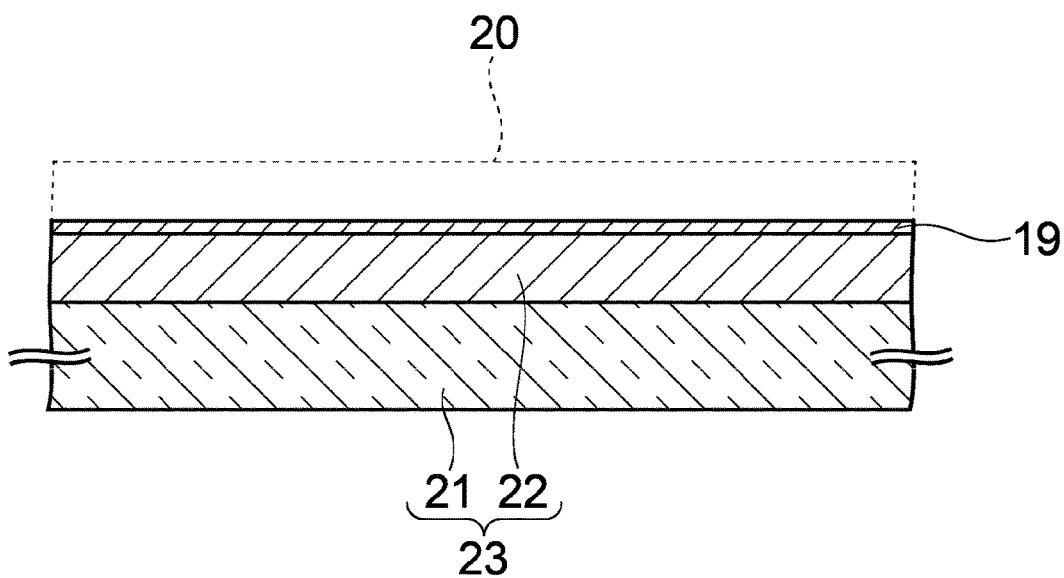

Through the above steps, obtained are the structure in which the light-receiving layer 14 is formed on the surface of the first supporting layer 16 as illustrated in FIG. 5B and the structure in which the hexagonal boron nitride layer 19 is formed on the surface of the second supporting layer 20 as illustrated in FIG. 7B. Thereafter, the light-receiving layer 14 and the hexagonal boron nitride layer 19 are transferred to a substrate for an element as follows. First, as illustrated in FIG. 8A, a substrate 23 for an element is prepared. The substrate 23 is formed of a silicon wafer 21 having a silicon oxide layer 22 formed thereon. The silicon oxide layer 22 functions as an insulating layer that electrically insulates elements such as electrodes and the light-receiving layer 14 to be formed on the silicon oxide layer 22 later, and is formed to a thickness of approximately 50 nm to 1000 nm, for example, approximately 100 nm. Then, as illustrated in FIG. 8B, the second supporting layer 20 is made to be in close contact with the substrate 23 while the hexagonal boron nitride layer 19 is located between the second supporting layer 20 and the substrate 23.

Accordingly, the hexagonal boron nitride layer 19 formed on the second supporting layer 20 sticks to the silicon oxide layer 22 because of van der Waals force, and the hexagonal boron nitride layer 19 is thus transferred to the silicon oxide layer 22.

When the substrate 23 is made to be in close contact with the second supporting layer 20, the substrate 23 may be heated to a temperature of a room temperature to approximately 300° C. This removes water from the boundary face between the hexagonal boron nitride layer 19 and the silicon oxide layer 22, enhancing the sticking force between them. Thereafter, the second supporting layer 20 is dissolved and removed with an organic solvent such as acetone.

Figure 9A:
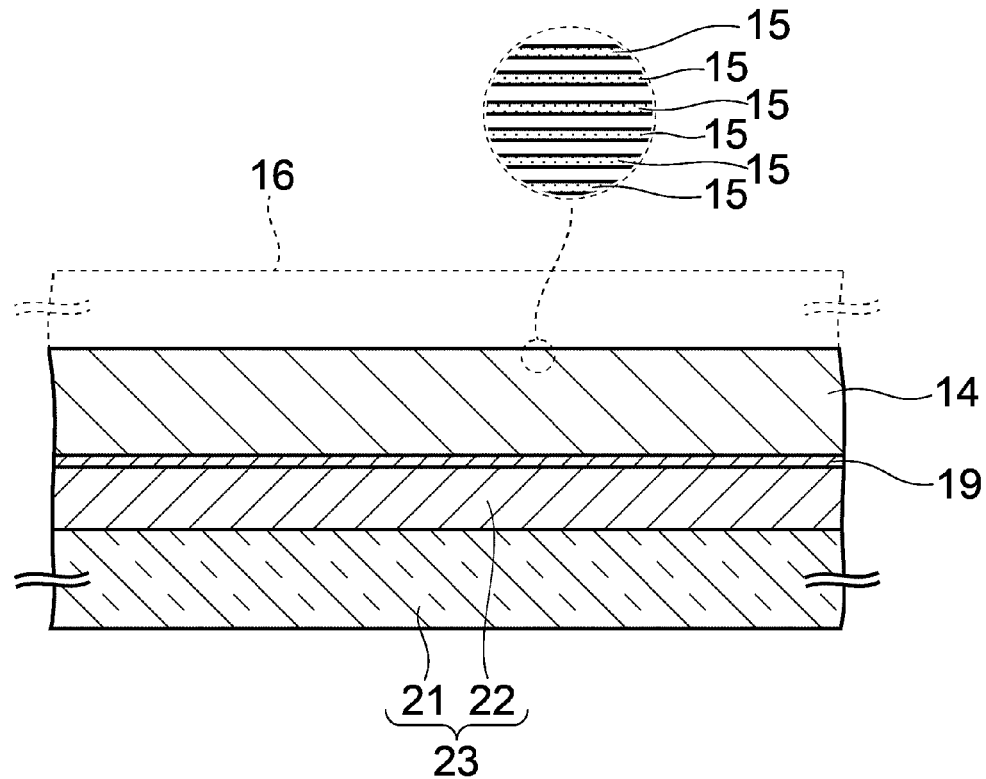
FIG. 9A and FIG. 9B are cross-sectional views (No. 6) of the photo detection element in accordance with the first embodiment in the process of production.

Then, as illustrated in FIG. 9A, the first supporting layer 16 is made to be in close contact with the substrate 23 while the light-receiving layer 14 is located between the first supporting layer 16 and the substrate 23. Accordingly, the graphene layers 15 formed on the first supporting layer 16 are transferred to the hexagonal boron nitride layer 19 at one time. The graphene layers 15 in the light-receiving layer 14 and the hexagonal boron nitride layer 19 stick to each other because of van der Waals force. Simultaneous transfer of the graphene layers 15 to the substrate 23 simplifies the process of forming the light-receiving layer 14 on the substrate 23. Thereafter, the first supporting layer 16 is dissolved and removed with an organic solvent such as acetone.

Figure 9B:
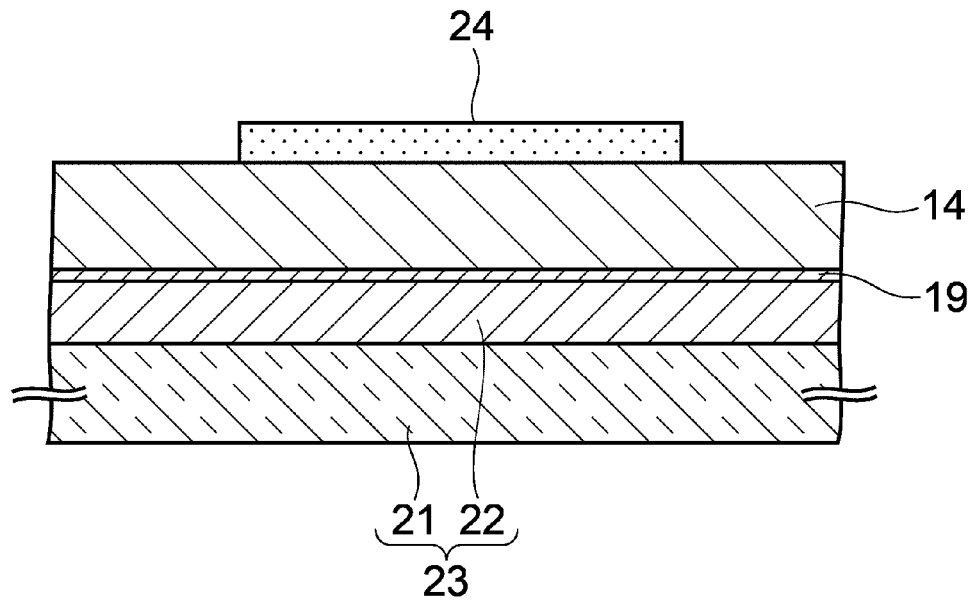

Through the above steps, the structure in which the hexagonal boron nitride layer 19 and the light-receiving layer 14 are stacked on the substrate 23 in this order is obtained. The hexagonal boron nitride layer 19 is an example of an underlying layer. Then, as illustrated in FIG. 9B, an island-shaped mask layer 24 is formed by applying photoresist on the hexagonal boron nitride layer 19, and then exposing and developing the photoresist.

Figure 10A:
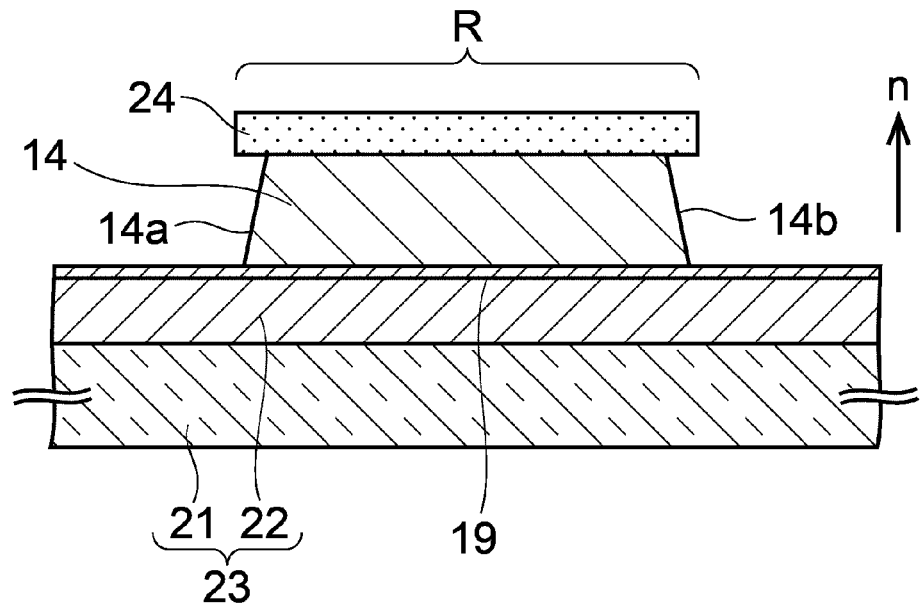
FIG. 10A and FIG. 10B are cross-sectional views (No. 7) of the photo detection element in accordance with the first embodiment in the process of production.
Figure 10B:
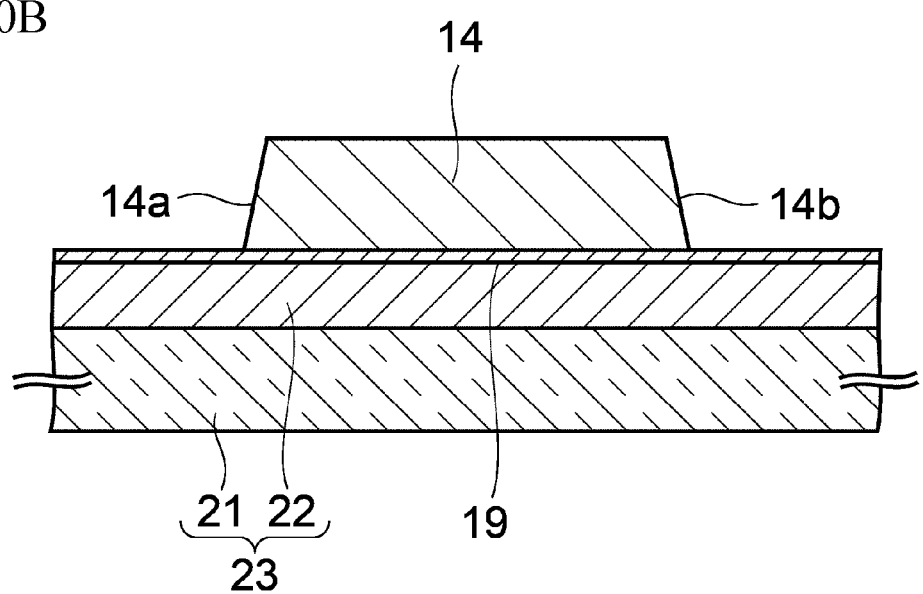

Then, as illustrated in FIG. 10A, a part, which is not covered with the mask layer 24, of the light-receiving layer 14 is isotropically etched by oxygen plasma to leave the light-receiving layer 14 only in a light-receiving region R that receives a light. Isotropic etching described above forms a first side surface 14a and a second side surface 14b, which are inclined with respect to the normal direction n of the substrate 23, in the light-receiving layer 14. Thereafter, as illustrated in FIG. 10B, the mask layer 24 is removed with an organic solvent such as acetone.

Figure 11A:
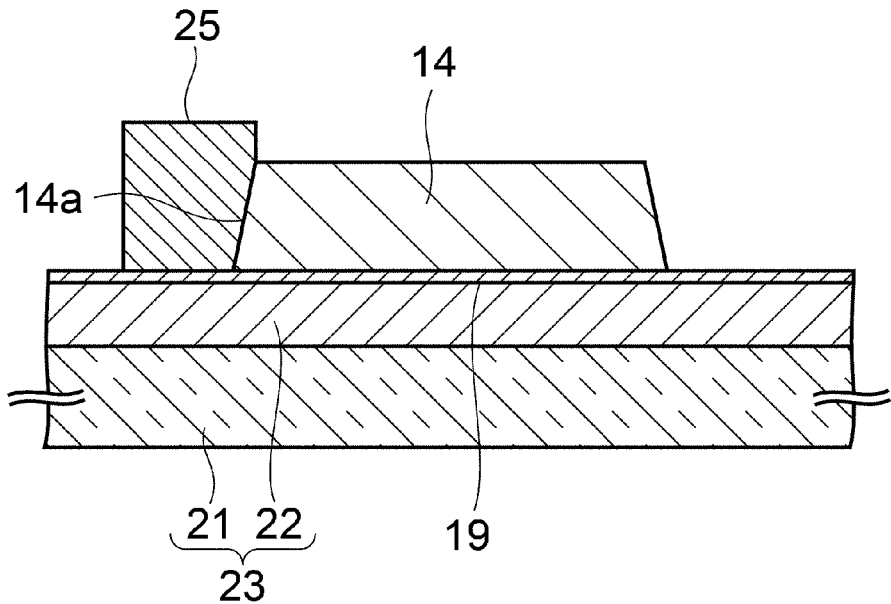
FIG. 11A and FIG. 11B are cross-sectional views (No. 8) of the photo detection element in accordance with the first embodiment in the process of production.

Then, as illustrated in FIG. 11A, a resist layer (not illustrated) having an opening to which the first side surface 14a is exposed is formed, and a titanium layer is then formed to a thickness of 0.02 µm to 1 µm across the entire upper surface of the substrate 23 by evaporation. Thereafter, the resist layer is removed to leave the titanium layer, as a first electrode 25, only on and beside the first side surface 14a and remove the unnecessary titanium layer.

Figure 11B:
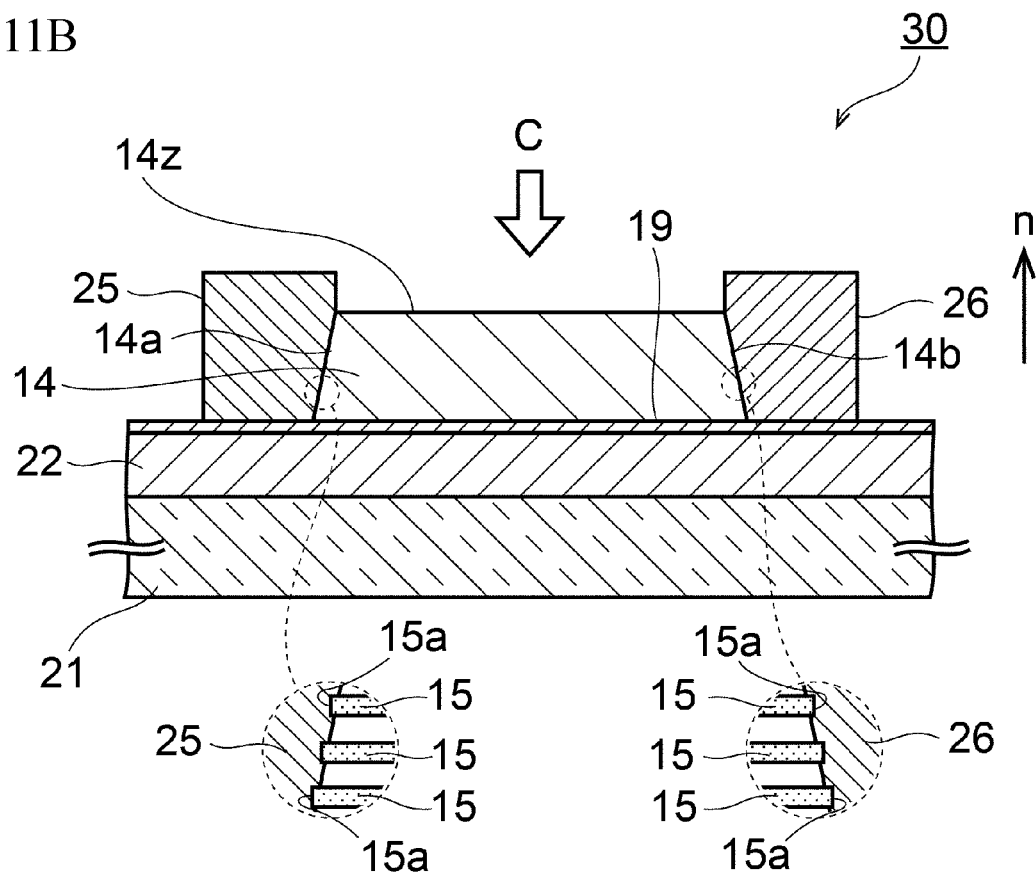

Then, as illustrated in FIG. 11B, a resist layer (not illustrated) having an opening to which the second side surface 14b is exposed is formed, and a metal layer of which the material differs from that of the first electrode 25 is then formed across the entire upper surface of the substrate 23 by evaporation. When a titanium layer is formed as the first electrode 25 as described above, a platinum layer is formed as the metal layer to a thickness of approximately 0.02 µm to 1 µm. Then, the resist layer is removed to leave the platinum layer, as a second electrode 26, only on and beside the second side surface 14b and remove the unnecessary platinum layer.

The combination of the materials of the first electrode 25 and the second electrode 26 are not limited to the above combination as long as the materials have different Seebeck coefficients. Examples of the material of the first electrode 25 include hafnium, zirconium, and chrome in addition to titanium. Examples of the material of the second electrode 26 include nickel, palladium, and gold in addition to platinum. Among the above-exemplified materials, hafnium, zirconium, titanium, and nickel in particular are more easily graphitized at the ends 15a of the graphene layers 15. Thus, use of these materials reduces the contact resistance between the graphene layers 15 and each of the electrodes 25 and 26.

The combination of the materials having different Seebeck coefficients may be a combination of metals used in a thermocouple. Examples of such combinations include alumel-chromel, iron-constantan, copper-constantan, chromel-constantan, nicrosil-nisil, and platinum rhodium-platinum. Through the above process, the fundamental structure of a photo detection element 30 in accordance with the first embodiment is completed.

In the photo detection element 30, the first electrode 25 and the second electrode 26 of which the materials differ from each other are formed at an interval so as to be in contact with the graphene layers 15 of the light-receiving layer 14.

Figure 13:
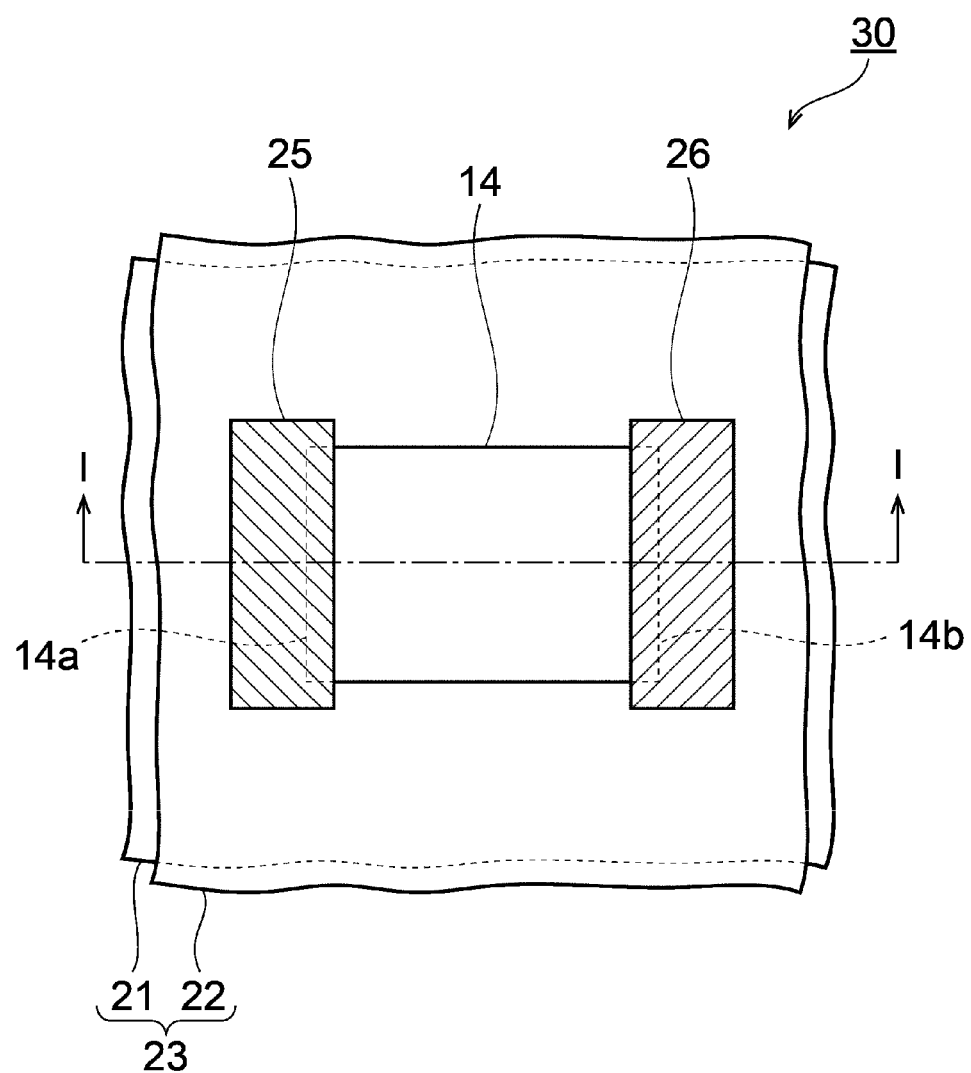
FIG. 13 is a plan view of the photo detection element in accordance with the first embodiment.

In the above-described structure, when a light C enters the surface 14z of the light-receiving layer 14, electrons in the graphene layers 15 are excited, and electrons having an electron temperature corresponding to the intensity of the light C are supplied from the graphene layers 15 to each of the electrodes 25 and 26. An electric potential difference corresponding to the intensity of the light C is generated between the electrodes 25 and 26 due to the difference in Seebeck coefficient between the electrodes 25 and 26, and the electric potential difference is output to the outside as an output voltage. Since the photo-thermoelectric effect of graphene of the graphene layers 15 is used as described above, it is not necessary to cool the photo detection element 30, and the applications of the photo detection element 30 are thus expanded. FIG. 13 is a plan view of the photo detection element 30, and FIG. 11B corresponds to the cross-sectional view taken along line I-I in FIG. 13. As illustrated in FIG. 13, the light-receiving layer 14 has a rectangular shape with a side of approximately 1 µm to 100 µm, and the electrodes 25 and 26 are respectively formed on the side surfaces 14a and 14b facing each other.

Figure 14:
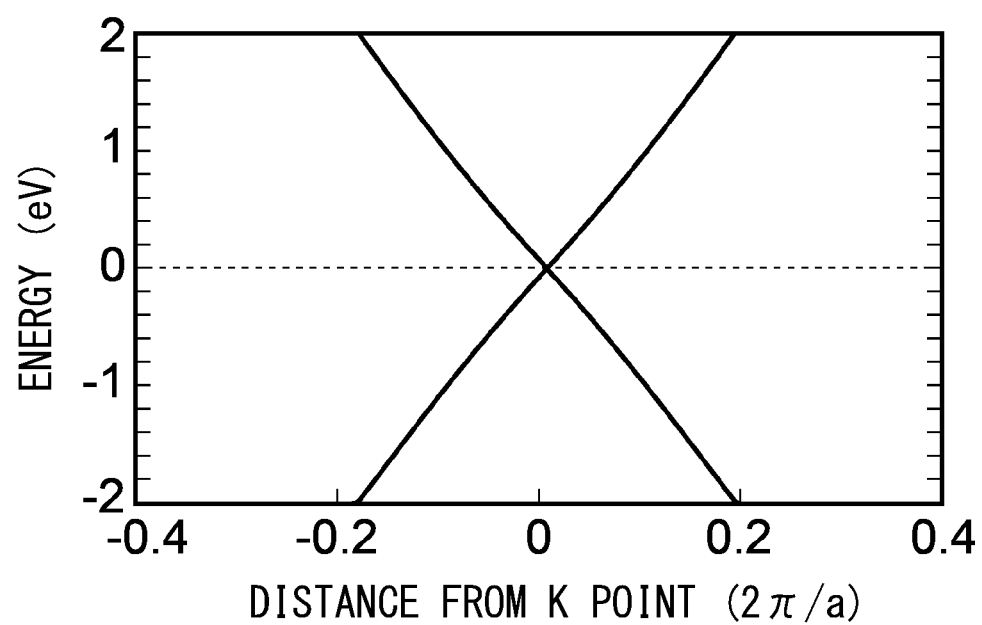
FIG. 14 illustrates the band structure of a light-receiving layer in accordance with the first embodiment.

In the first embodiment described above, as illustrated in FIG. 12, the light-receiving layer 14 is formed of the graphene layers 15 of which the lattices are randomly displaced from each other in plan view. Since the lattices are displaced as described above, the graphene layers 15 are inhibited from forming graphite, and the light-receiving layer 14 having the same electronic state as graphene is obtained. FIG. 14 illustrates the band structure of the light-receiving layer 14.

As in FIG. 3A and FIG. 3B, the horizontal axis in FIG. 14 represents a distance from the K point in the reciprocal lattice space when "a" represents the lattice length of graphene (0.249 nm). The vertical axis represents the energy of electron (eV).

As illustrated in FIG. 14, since the first embodiment can inhibit the light-receiving layer 14 from being graphitized, the band curve of the light-receiving layer 14 is linear at the K point of the reciprocal lattice space as with the band curve of graphene. The band curve can be obtained by, for example, angle-resolved photoemission spectroscopy.

As a result, the photo-thermoelectric effect is exerted in each of the graphene layers 15 of the light-receiving layer 14 while the characteristics of graphene such as high electron mobility and wavelength-independent light absorptivity are taken advantage of, and the sensitivity of the photo detection element 30 is thus enhanced.

According to estimates by the inventors, when the number of the graphene layers 15 in the light-receiving layer 14 is 100, the light absorptivity of the light-receiving layer 14 is 95% or greater, which means the sensitivity is approximately 50 times the sensitivity when only a single graphene monoatomic layer 15 is formed.

In addition, in the first embodiment, the first side surface 14a of the light-receiving layer 14 is inclined with respect to the normal direction n of the substrate 23. Thus, the material of the first electrode 25 easily adheres onto the ends 15a of the graphene layers 15. As a result, the ends 15a are more reliably in contact with the first electrode 25, and the contact resistance between the light-receiving layer 14 and the first electrode 25 is thereby reduced. In addition, each graphene layer 15 is more easily in contact with the first electrode 25. Thus, as the number of the graphene layers 15 increases, the contact resistance between the light-receiving layer 14 and the first electrode 25 decreases. For the same reason, since the second side surface 14b is inclined with respect to the normal direction n, the contact resistance between the second electrode 26 and the light-receiving layer 14 is reduced.

When the graphene layer 15 is directly formed on the substrate 23, electrons transmitting through the graphene layer 15 may be scattered by surface polar phonons of the silicon oxide layer 22, and the electron mobility may decrease. Thus, as in the first embodiment, it is preferable that the hexagonal boron nitride layer 19 is formed, as an underlying layer, under the light-receiving layer 14 to inhibit, by the hexagonal boron nitride layer 19, the surface polar phonons of the silicon oxide layer 22 from affecting the graphene layers 15.

Figure 15:
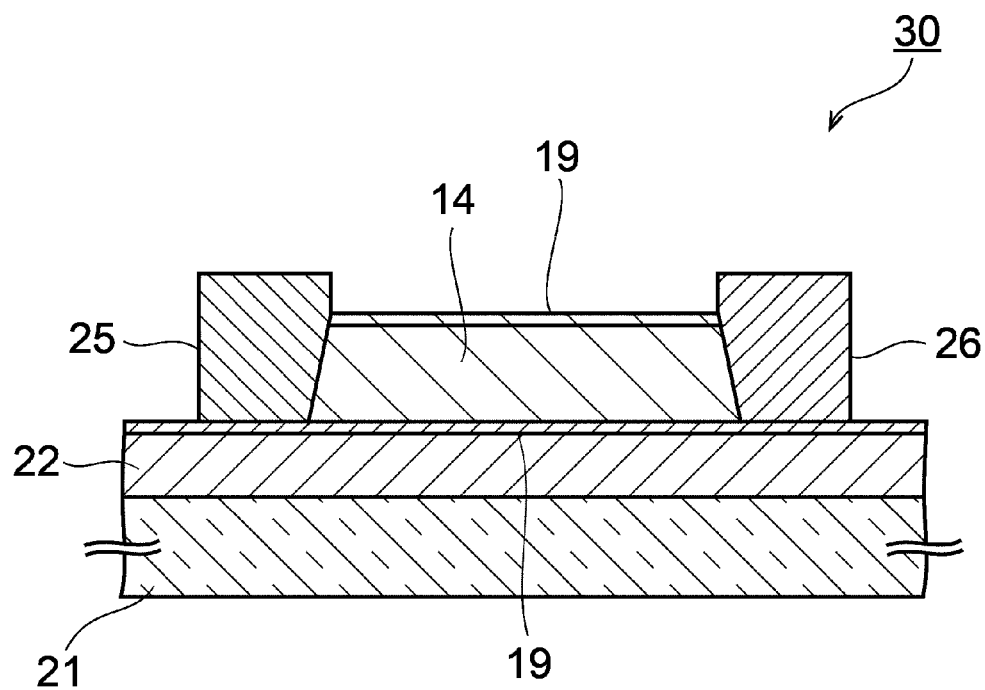
FIG. 15 is a cross-sectional view of the photo detection element when a hexagonal boron nitride layer is formed on the upper surface of the light-receiving layer in the first embodiment.

In particular, since the hexagonal boron nitride layer 19 excels in maintaining the electron mobility in the graphene layer 15 high, the hexagonal boron nitride layer 19 is suitable for the underlying layer formed under the light-receiving layer 14. Examples of the underlying layer having a function of reducing the effect of surface polar phonons include, but are not limited to, a diamond-like carbon layer in addition to a hexagonal boron nitride layer. To protect the light-receiving layer 14 from the atmosphere, the hexagonal boron nitride layer 19 may be formed, as a protective layer, on the upper surface of the light-receiving layer 14. FIG. 15 is a cross-sectional view of the photo detection element 30 when the hexagonal boron nitride layer 19 is formed on the upper surface of the light-receiving layer 14.

The hexagonal boron nitride layer 19 is an insulating layer transparent to infrared lights. Thus, when the photo detection element 30 is used as an infrared detecting element, infrared lights are prevented from being blocked by the hexagonal boron nitride layer 19, and electric short circuit between the electrodes 25 and 26 due to the hexagonal boron nitride layer 19 does not occur.

The hexagonal boron nitride layer 19 on the upper surface of the light-receiving layer 14 may be formed as follows. After the light-receiving layer 14 is transferred to the substrate 23 in the step of FIG. 9A, the hexagonal boron nitride layer 19 with a thickness of the thickness of a monoatomic layer (0.34 nm) to approximately 100 nm is transferred to the light-receiving layer 14 as in the step of FIG. 8B.

Second Embodiment

Figure 4C:
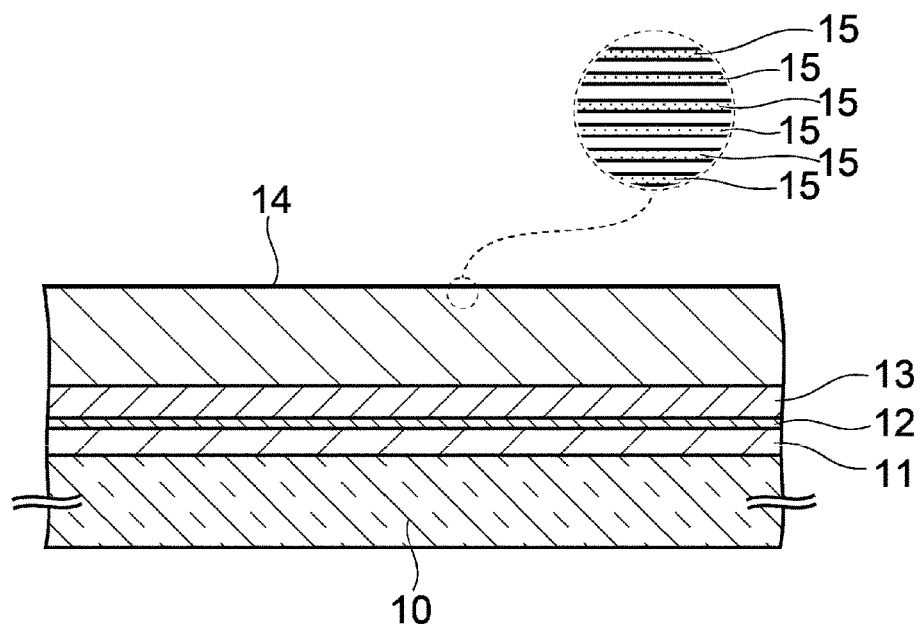

In the first embodiment, the light-receiving layer 14 in which the graphene layers 15 are stacked is formed in one film-formation process as described with reference to FIG. 4C. In a second embodiment, the light-receiving layer 14 is formed by a method different from the method of the first embodiment.

FIG. 16A through FIG. 19 are cross-sectional views of a photo detection element in accordance with the second embodiment in the process of production. In FIG. 16A through FIG. 19, the same reference numerals are used for the same elements as those described in the first embodiment, and the description thereof is omitted.

Figure 16A:
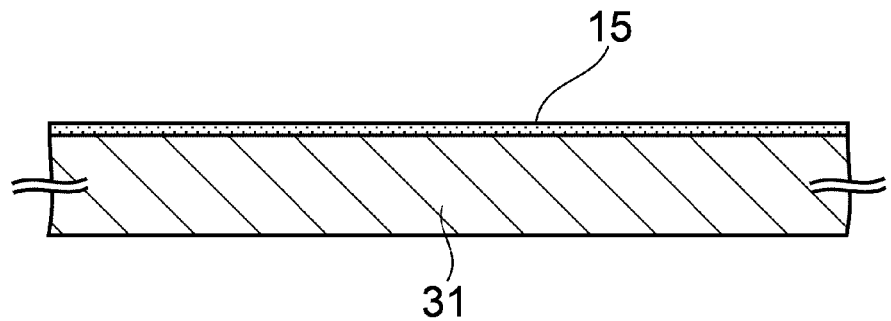
FIG. 16A through FIG. 16C are cross-sectional views (No. 1) of a photo detection element in accordance with a second embodiment in the process of production.

First, as illustrated in FIG. 16A, a copper foil is prepared as a catalytic metal layer 31, and the catalytic metal layer 31 is placed in a thermal CVD furnace (not illustrated). Then, a mixed gas of methane, hydrogen, and argon is supplied to the furnace while the catalytic metal layer 31 is heated to approximately 1000° C. This state is maintained for approximately 30 minutes, and thereby, the catalytic action of the catalytic metal layer 31 causes a graphene monoatomic layer 15 to grow on the catalytic metal layer 31.

Instead of the catalytic metal layer 31, a silicon substrate having a silicon oxide layer formed on the surface thereof may be prepared. Then, a catalytic metal layer such as a copper layer may be formed on the surface of the silicon oxide layer, and a graphene monoatomic layer 15 may be then formed on the catalytic metal layer.

Figure 16B:
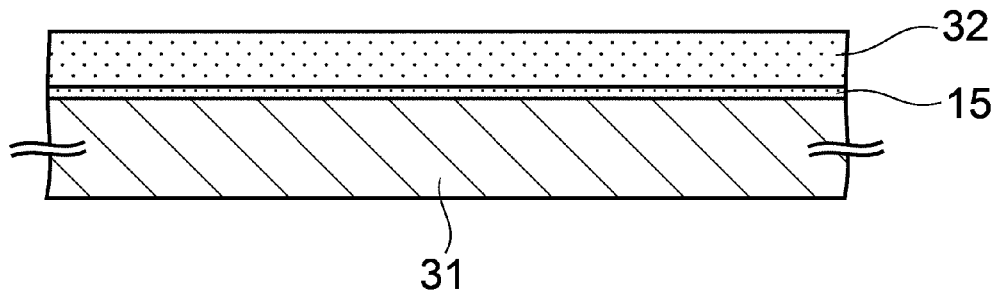

Then, as illustrated in FIG. 16B, a polymer such as PMMA is applied to a thickness of approximately 0.1 μm to 100 μm on the graphene layer 15 by spin coating. The polymer coating film is referred to as a third supporting layer 32. Instead of a polymer, a resist coating film may be formed as the third supporting layer 32. Thereafter, the third supporting layer 32 is heated to a temperature of a room temperature to approximately 200° C. to remove the solvent component in the film.

Figure 16C:
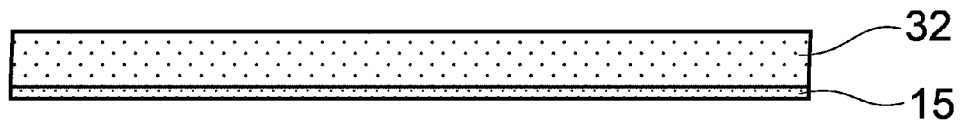
Figure 17A:
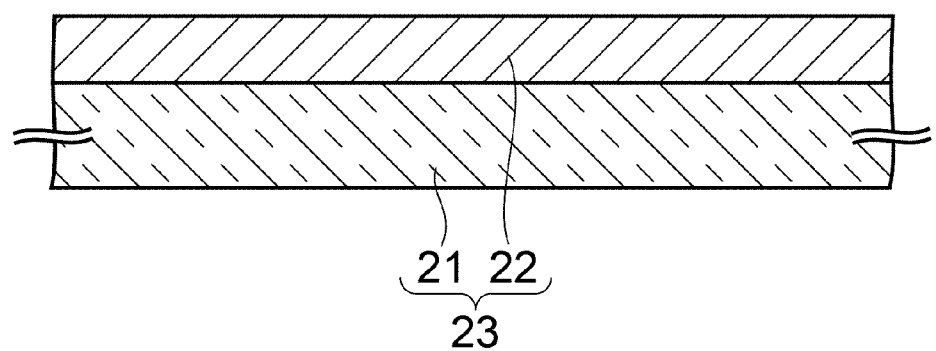
FIG. 17A and FIG. 17B are cross-sectional views (No. 2) of the photo detection element in accordance with the second embodiment in the process of production.

Then, as illustrated in FIG. 16C, the catalytic metal layer 31 is dissolved and removed with, for example, a ferric chloride solution, and the structure in which the graphene monoatomic layer 15 is formed on the surface of the third supporting layer 32 is obtained. Then, as illustrated in FIG. 17A, the substrate 23 for an element is prepared separately from the above-described catalytic metal layer 31. The substrate 23 has a structure in which the silicon oxide layer 22 is formed on the silicon wafer 21.

Figure 17B:
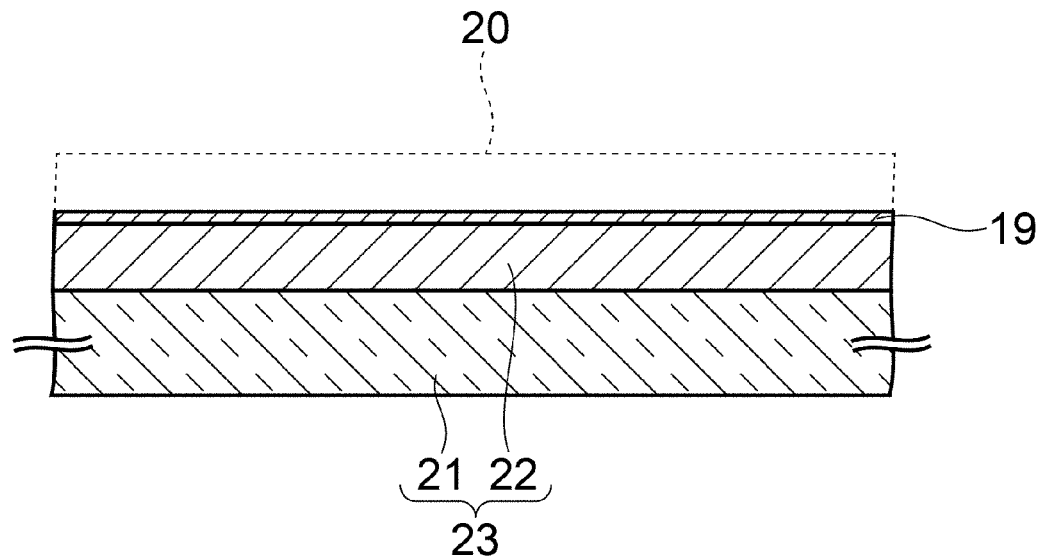

Then, as illustrated in FIG. 17B, according to the steps of FIG. 6A to FIG. 7B of the first embodiment, the second supporting layer 20 is formed on the hexagonal boron nitride layer 19. Then, the second supporting layer 20 is made to be in close contact with the substrate 23 while the hexagonal boron nitride layer 19 is located between the second supporting layer 20 and the substrate 23 to transfer the hexagonal boron nitride layer 19 to the substrate 23. Thereafter, the second supporting layer 20 is dissolved and removed with an organic solvent such as acetone.

Figure 18A:
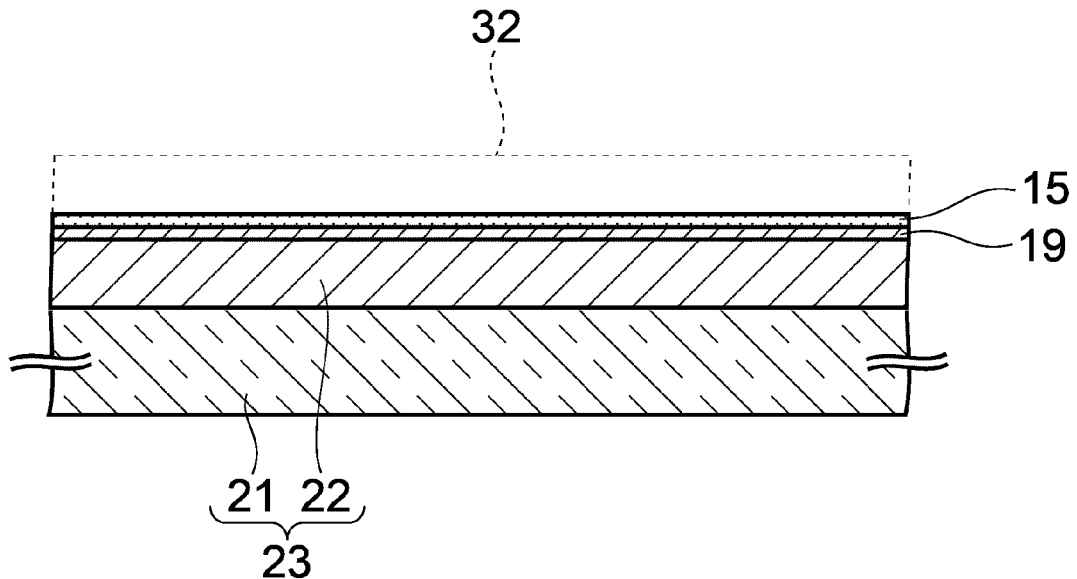
FIG. 18A and FIG. 18B are cross-sectional views (No. 3) of the photo detection element in accordance with the second embodiment in the process of production.

Then, as illustrated in FIG. 18A, the third supporting layer 32 having a graphene monoatomic layer 15 formed on the surface thereof as illustrated in FIG. 16C is prepared. Then, the third supporting layer 32 is made to be in close contact with the substrate 23 while the graphene layer 15 is located between the third supporting layer 32 and the substrate 23 to transfer the graphene monoatomic layer 15 to the hexagonal boron nitride layer 19. Thereafter, the third supporting layer 32 is dissolved and removed with an organic solvent such as acetone.

Figure 18B:
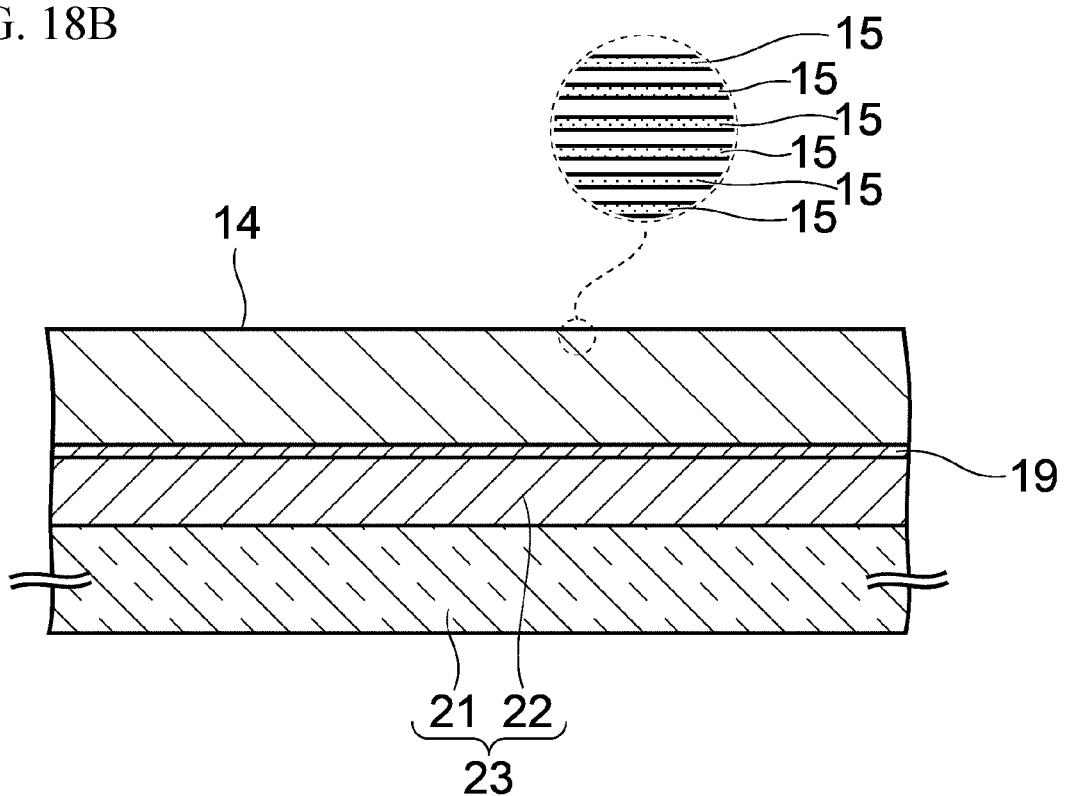
Figure 19:
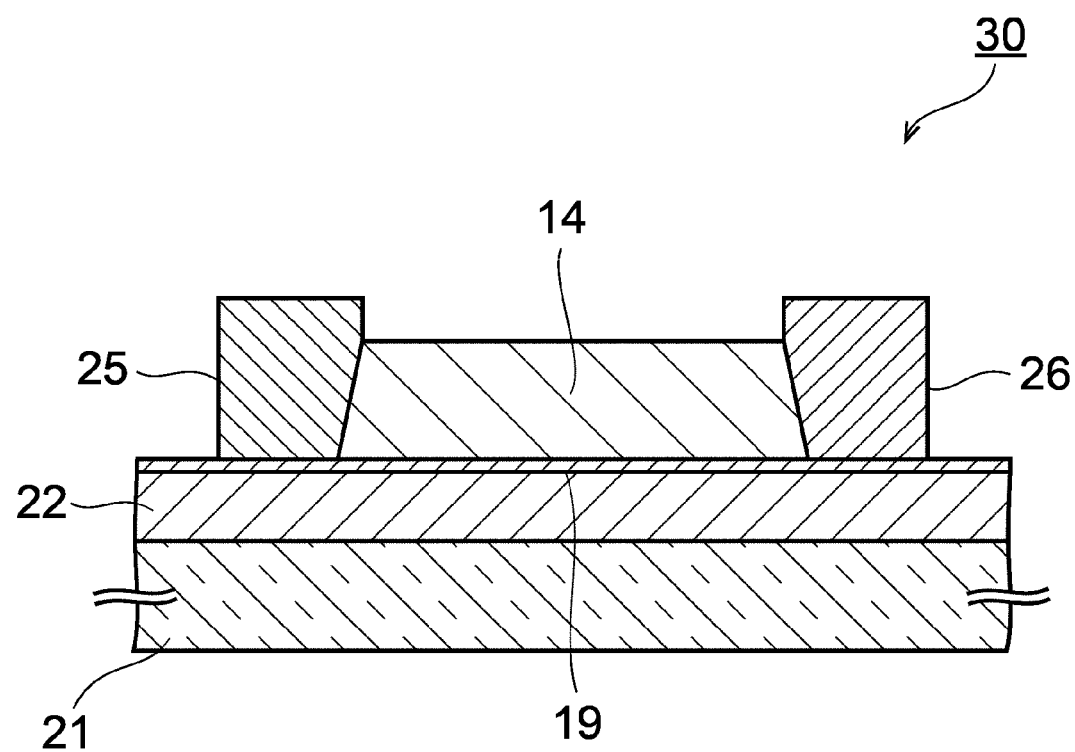
FIG. 19 is a cross-sectional view (No. 4) of the photo detection element in accordance with the second embodiment in the process of production.

Then, as illustrated in FIG. 18B, the above described graphene layer 15 is transferred one layer by one layer. At this time, the positions of the substrate 23 and the third supporting layer 32 are randomly displaced from each other in the substrate plane every time the graphene layer 15 is transferred such that the lattices of the graphene layers 15 are randomly displaced from each other in plan view. The displacement direction is not particularly limited. The substrate 23 and the third supporting layer 32 may be mutually rotated in the substrate plane, or may be mutually moved in parallel in the substrate plane.

Accordingly, as in FIG. 12 of the first embodiment, formed is the light-receiving layer 14 formed of the graphene layers 15 that are stacked and of which the lattices are randomly displaced from each other in plan view. The number of the graphene layers 15 that are stacked in the light-receiving layer 14 is 5 to 500, for example, 100. Thereafter, the steps of FIG. 9B to FIG. 11B of the first embodiment are conducted to obtain the fundamental structure of the photo detection element 30 of the second embodiment illustrated in FIG. 19.

Also in the second embodiment described above, the lattices of the graphene layers 15 in the light-receiving layer 14 are randomly displaced from each other. Thus, as in the first embodiment, the light-receiving layer 14 is inhibited from being graphitized, and the sensitivity of the photo detection element 30 is enhanced.

In addition, in the second embodiment, as illustrated in FIG. 18A through FIG. 18B, the graphene layers 15 are transferred to the substrate 23 one layer by one layer while the positions of the substrate 23 and the third supporting layer 32 are randomly displaced from each other. Thus, the lattices of the graphene layers 15 are reliably displaced from each other.

Third Embodiment

A third embodiment inhibits the surface polar phonons of the substrate 23 from affecting the graphene layers 15 in the following manner.

FIG. 20A through FIG. 21B are cross-sectional views of a photo detection element in accordance with the third embodiment in the process of production. In FIG. 20A through FIG. 21B, the same reference numerals are used for the same elements as those described in the first embodiment, and the description thereof is omitted.

Figure 20A:
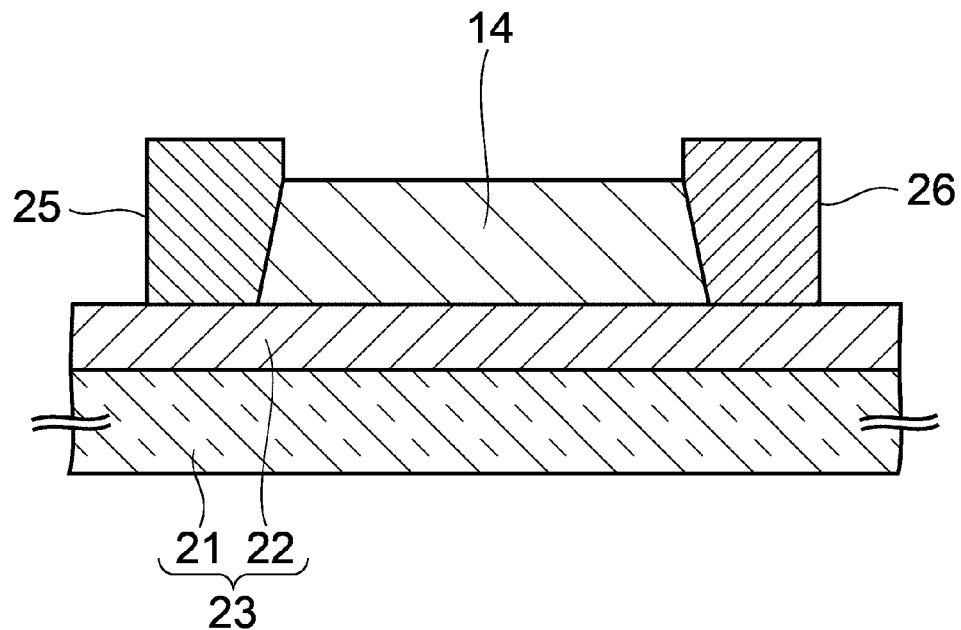
FIG. 20A and FIG. 20B are cross-sectional views (No. 1) of a photo detection element in accordance with a third embodiment in the process of production.

First, the steps of FIG. 4A through FIG. 11B of the first embodiment are conducted to obtain the structure in which the light-receiving layer 14 and the electrodes 25 and 26 are formed on the substrate 23 as illustrated in FIG. 20A. However, in the third embodiment, the hexagonal boron nitride layer 19 (see FIG. 11B) is not formed on the silicon oxide layer 22. Instead, the light-receiving layer 14 is directly formed on the silicon oxide layer 22 with a thickness of approximately 1000 nm.

Figure 20B:
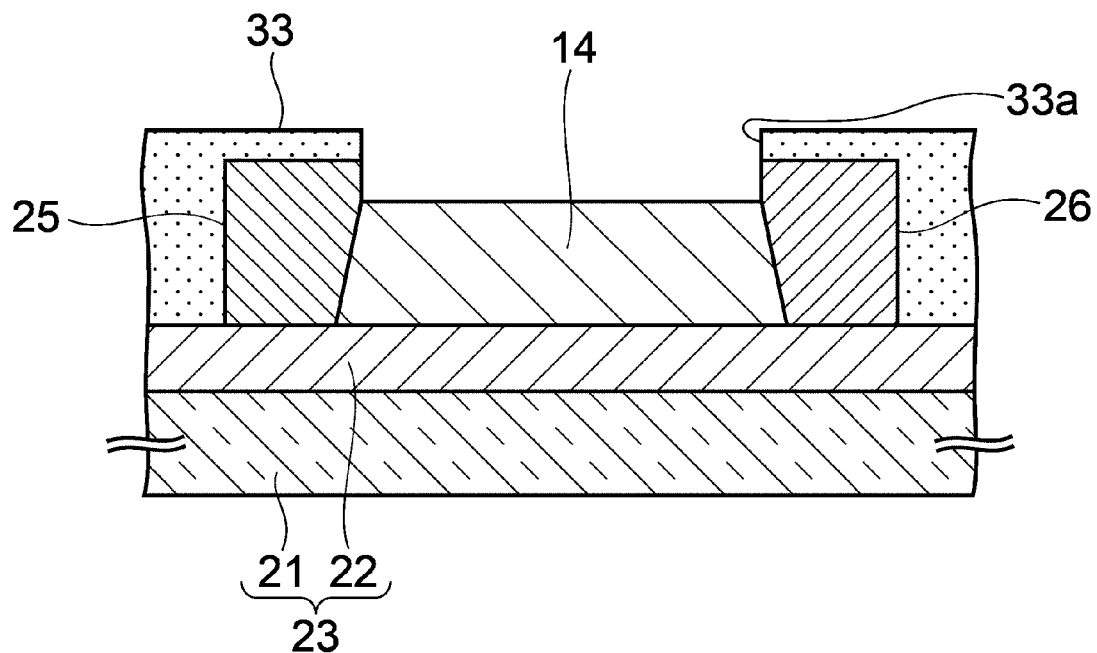
Figure 22:
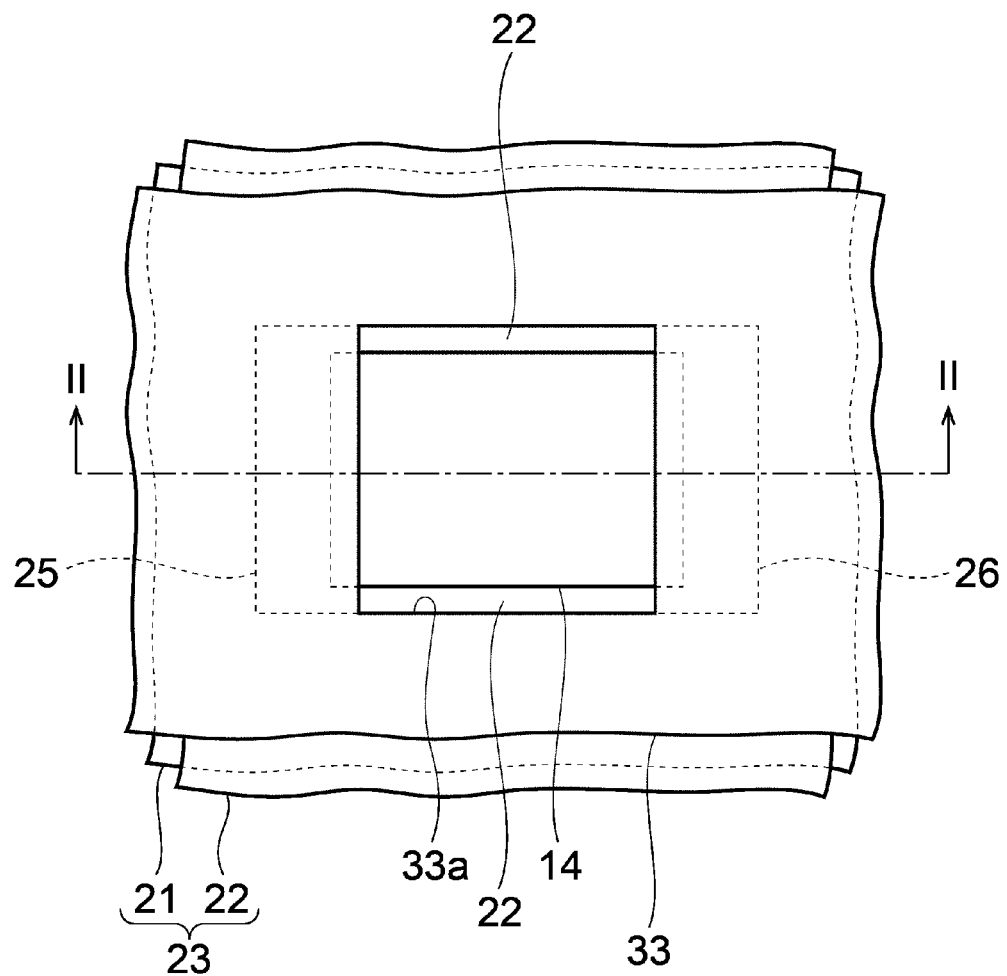
FIG. 22 is a plan view (No. 1) of the photo detection element in accordance with the third embodiment in the process of production.

Then, as illustrated in FIG. 20B, photoresist is applied across the entire upper surface of the substrate 23, and the photoresist is then exposed and developed to form a mask layer 33 having an opening 33a above the light-receiving layer 14. FIG. 22 is a plan view after the step of FIG. 20B, and FIG. 20B corresponds to the cross-sectional view taken along line II-II in FIG. 22. As illustrated in FIG. 22, gaps are formed between the opening 33a and the light-receiving layer 14, and the silicon oxide layer 22 is exposed from the gaps.

Figure 21A:
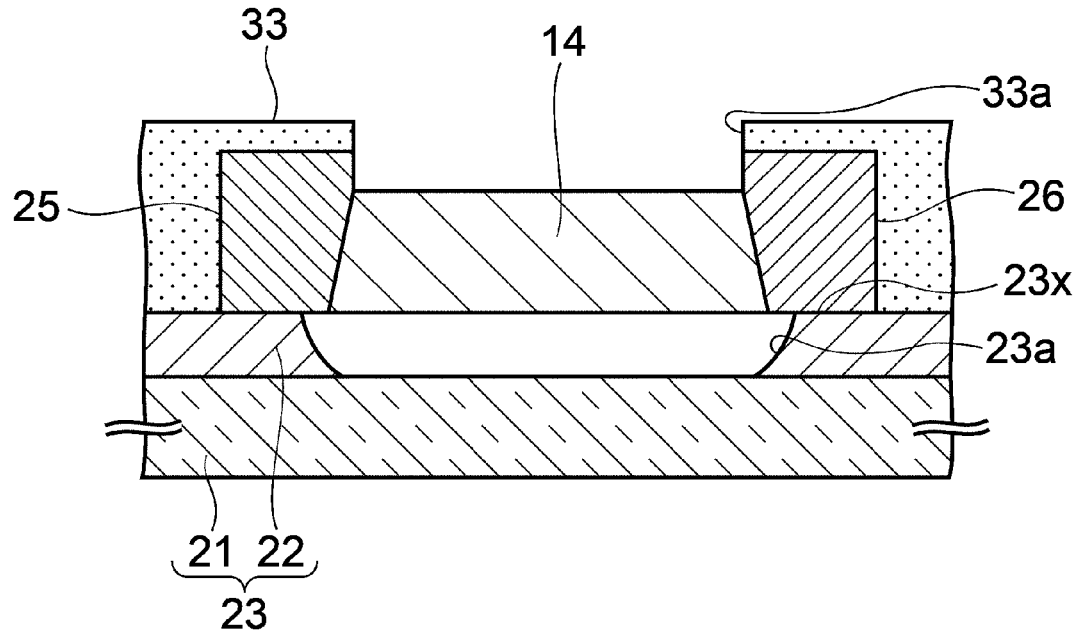
FIG. 21A and FIG. 21B are cross-sectional views (No. 2) of the photo detection element in accordance with the third embodiment in the process of production.
Figure 21B:
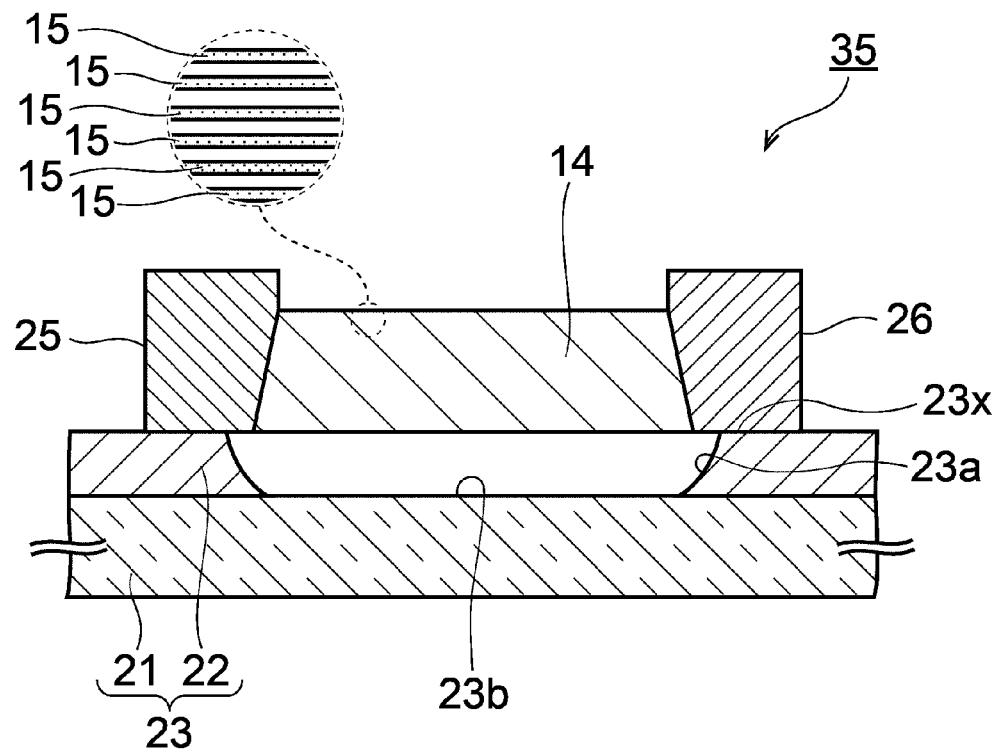
Figure 23:
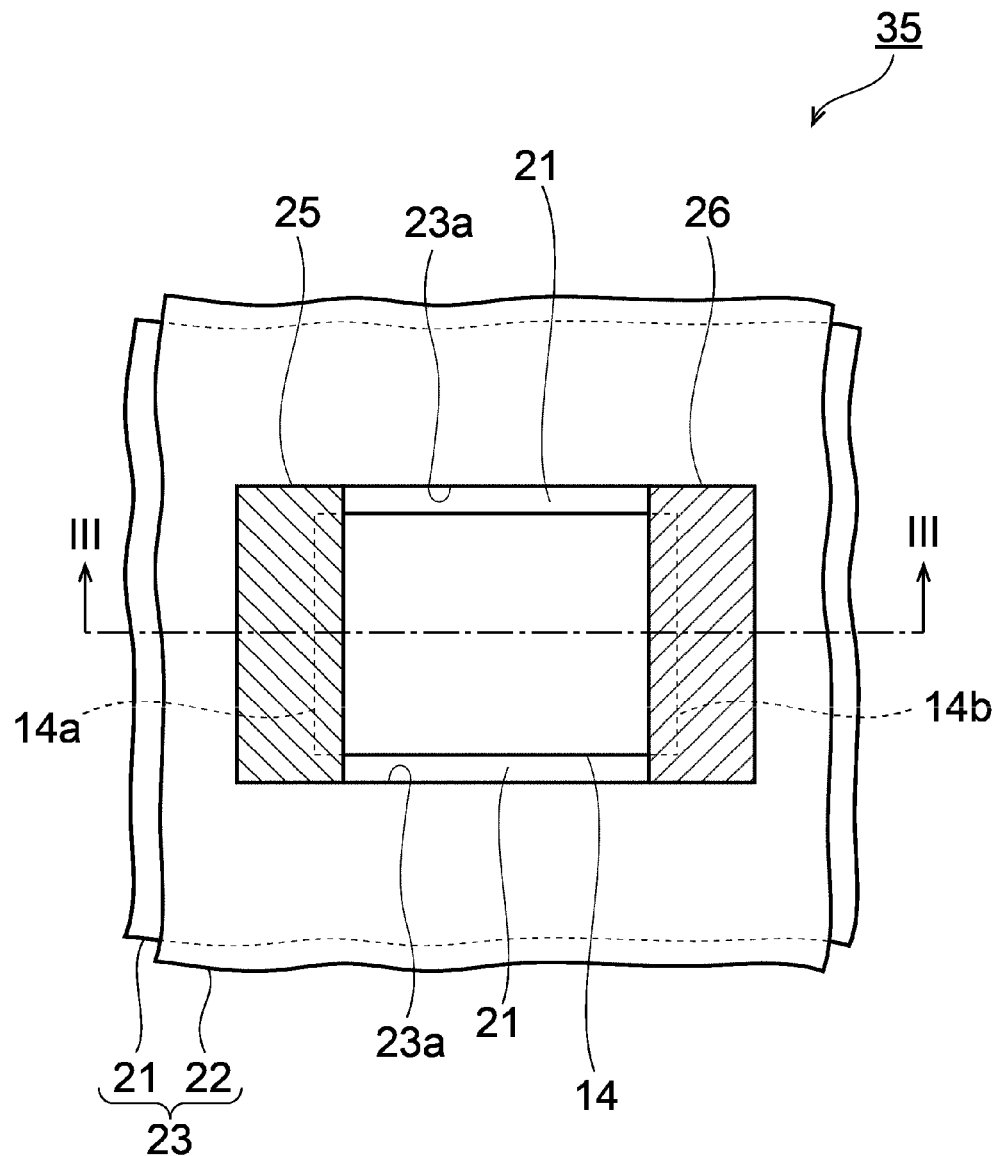
FIG. 23 is a plan view (No. 2) of the photo detection element in accordance with the third embodiment in the process of production.

Then, as illustrated in FIG. 21A, parts, which are exposed from the opening 33a, of the silicon oxide layer 22 are etched by buffered hydrofluoric acid to form a recessed portion 23a on the surface 23x of the substrate 23 under the light-receiving layer 14. Thereafter, as illustrated in FIG. 21B, the mask layer 33 is removed, and the fundamental structure of a photo detection element 35 in accordance with the third embodiment is completed. FIG. 23 is a plan view after the step of FIG. 21B, and FIG. 21B corresponds to the cross-sectional view taken along line III-III in FIG. 23. As illustrated in FIG. 23, the silicon wafer 21 is exposed to the gaps between the recessed portion 23a and the light-receiving layer 14.

In the third embodiment described above, as illustrated in FIG. 21B, the recessed portion 23a is formed in the substrate 23 under the light-receiving layer 14, and the light-receiving layer 14 is located above and away from the lower surface 23b of the recessed portion 23a. This structure inhibits the surface polar phonons of the lower surface 23b from affecting the graphene layers 15, and allows the mobility of electrons in the graphene layers 15 to be maintained high.

In particular, the silicon oxide layer 22 greatly decreases the mobility of electrons in the graphene layers 15 by the surface polar phonons of the silicon oxide layer 22. Thus, it is preferable that decrease in mobility is reduced by forming the recessed portion 23a.

Fourth Embodiment

In a fourth embodiment, the contact resistances between the graphene layers 15 and the electrodes 25 and 26 are reduced.

Figure 24A:
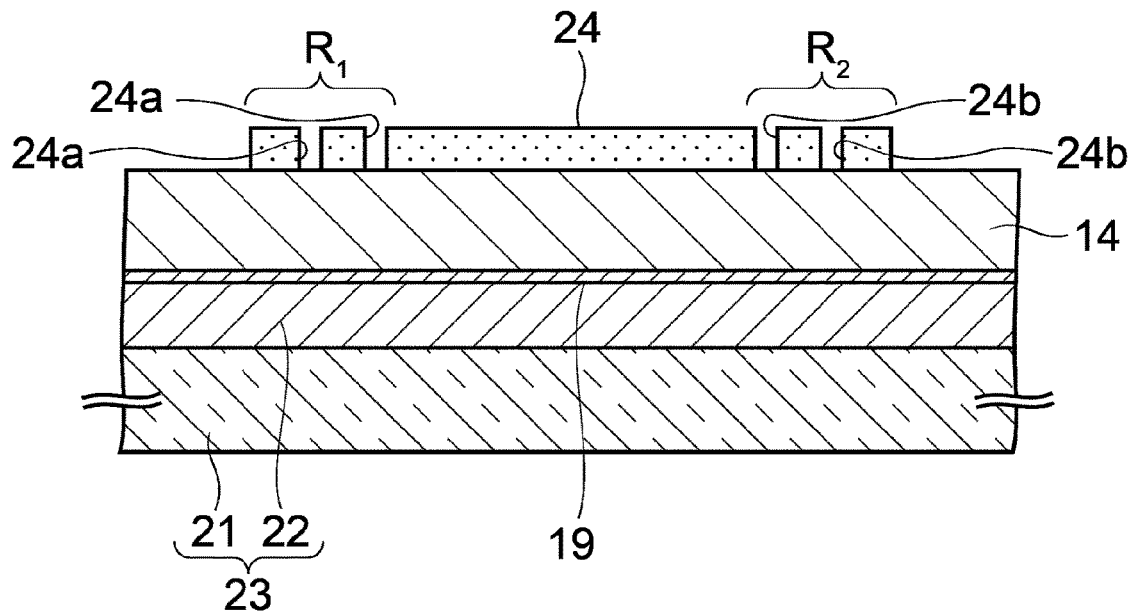
FIG. 24A and FIG. 24B are cross-sectional views (No. 1) of a photo detection element in accordance with a fourth embodiment in the process of production.

FIG. 24A through FIG. 26 are cross-sectional views of a photo detection element in accordance with the fourth embodiment in the process of production. In FIG. 24A through FIG. 26, the same reference numerals are used for the same elements as those described in the first to third embodiments, and the description thereof is omitted. First, the steps of FIG. 4A through FIG. 9B described in the first embodiment are conducted to obtain the structure in which the mask layer 24 is formed on the light-receiving layer 14 as illustrated in FIG. 24A.

However, in the fourth embodiment, first openings 24a are formed in the mask layer 24 in a first region $R_1$ where the electrode is to be formed later, and second openings 24b are formed in the mask layer 24 in a second region $R_2$ where the electrode is to be formed later.

Figure 24B:
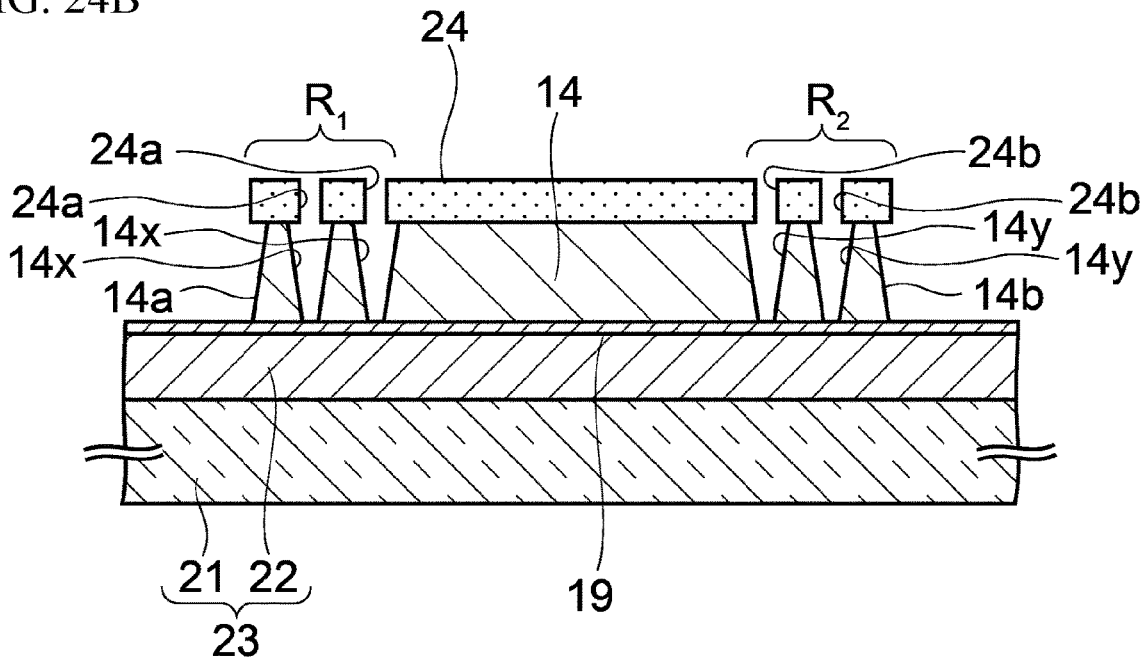
Figure 25A:
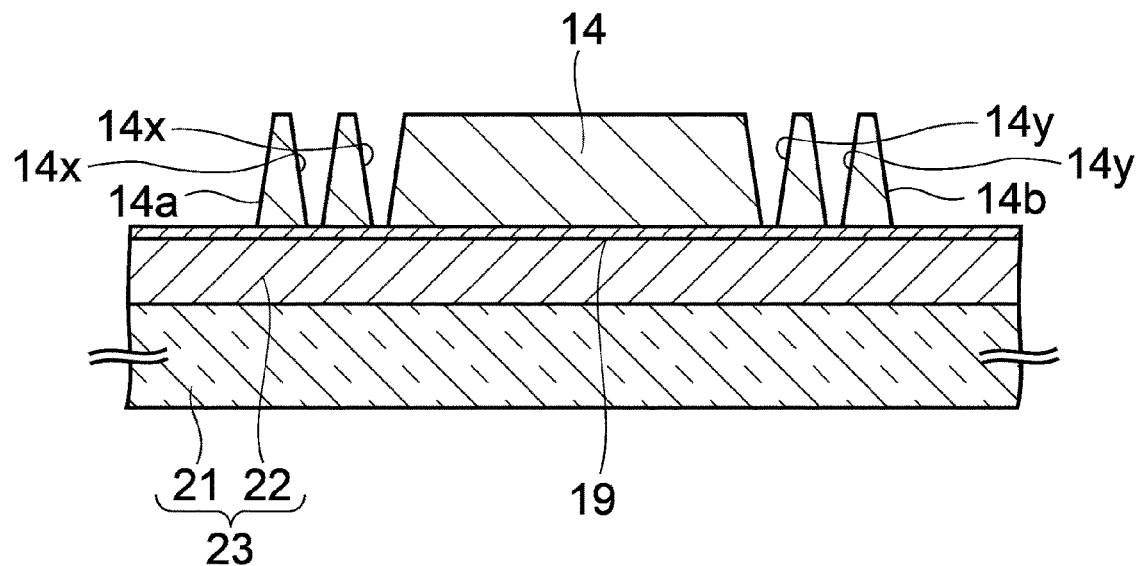
FIG. 25A and FIG. 25B are cross-sectional views (No. 2) of the photo detection element in accordance with the fourth embodiment in the process of production.

Then, as illustrated in FIG. 24B, the light-receiving layer 14 is isotropically etched by oxygen plasma through the openings 24a and 24b. Thus, in the first region $R_1$, tapered first holes 14x and the first side surface 14a are formed in the light-receiving layer 14. In the second region $R_2$, tapered second holes 14y and the second side surface 14b are formed in the light-receiving layer 14. These holes 14x and 14y have diameters of, for example, approximately 0.02 μm to 2 μm. Thereafter as illustrated in FIG. 25A, the mask layer 24 is removed.

Figure 25B:
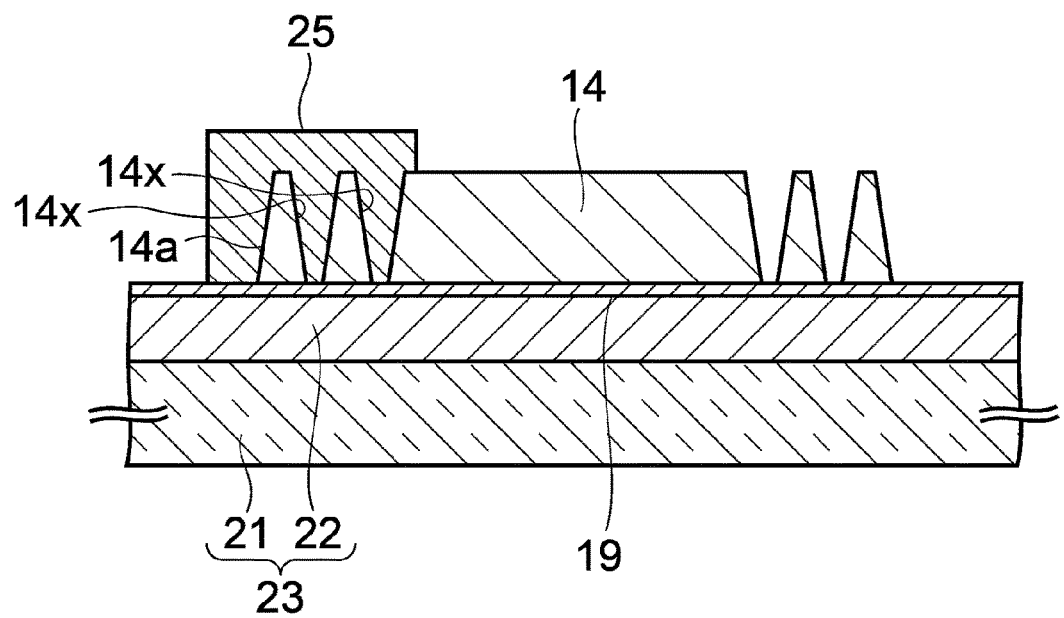

Then, as illustrated in FIG. 25B, a resist layer (not illustrated) having an opening to which the first side surface 14a and the first holes 14x are exposed is formed, and a titanium layer is then formed across the entire upper surface of the substrate 23 by evaporation. Thereafter, the resist layer is removed to leave the titanium layer, as the first electrode 25, in the first holes 14x and on the first side surface 14a, and remove the unnecessary titanium layer.

Figure 26:
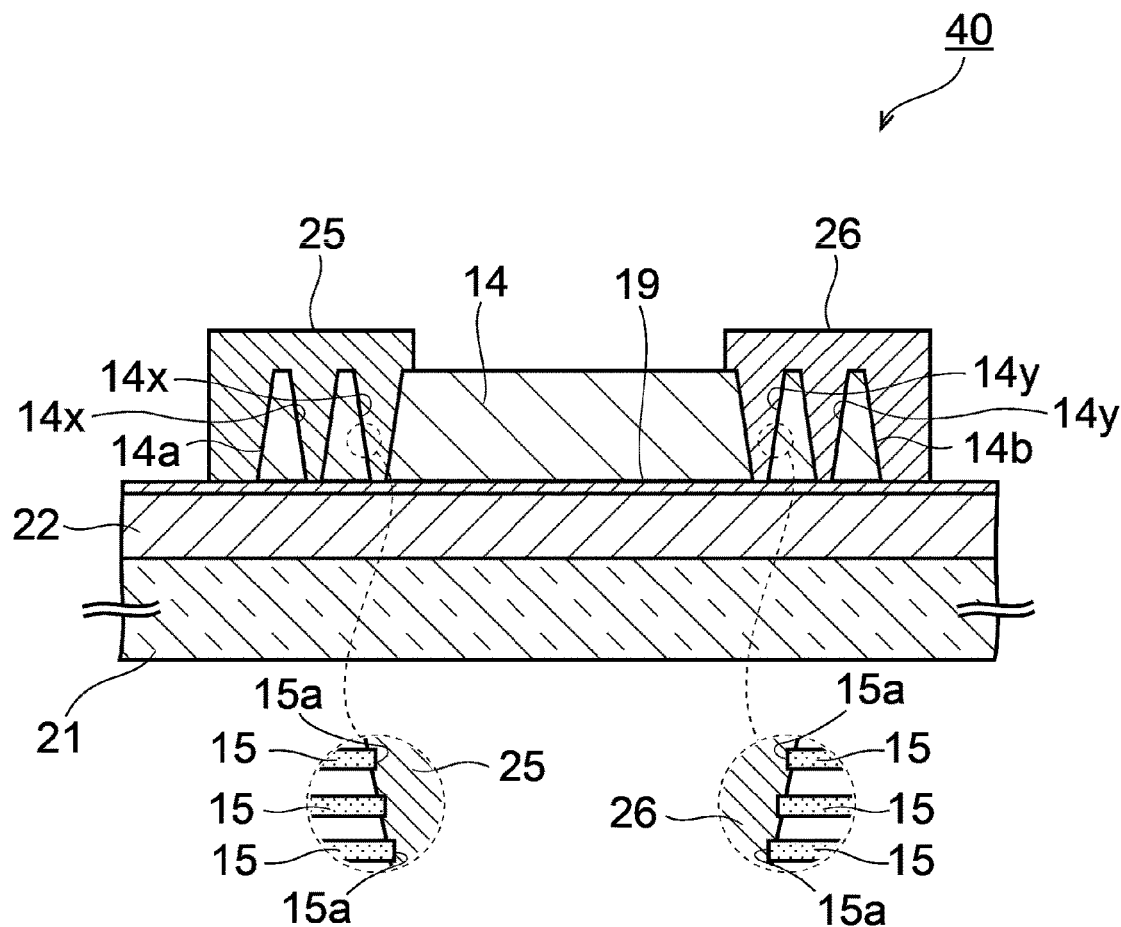
FIG. 26 is a cross-sectional view (No. 3) of the photo detection element in accordance with the fourth embodiment in the process of production.
Figure 27:
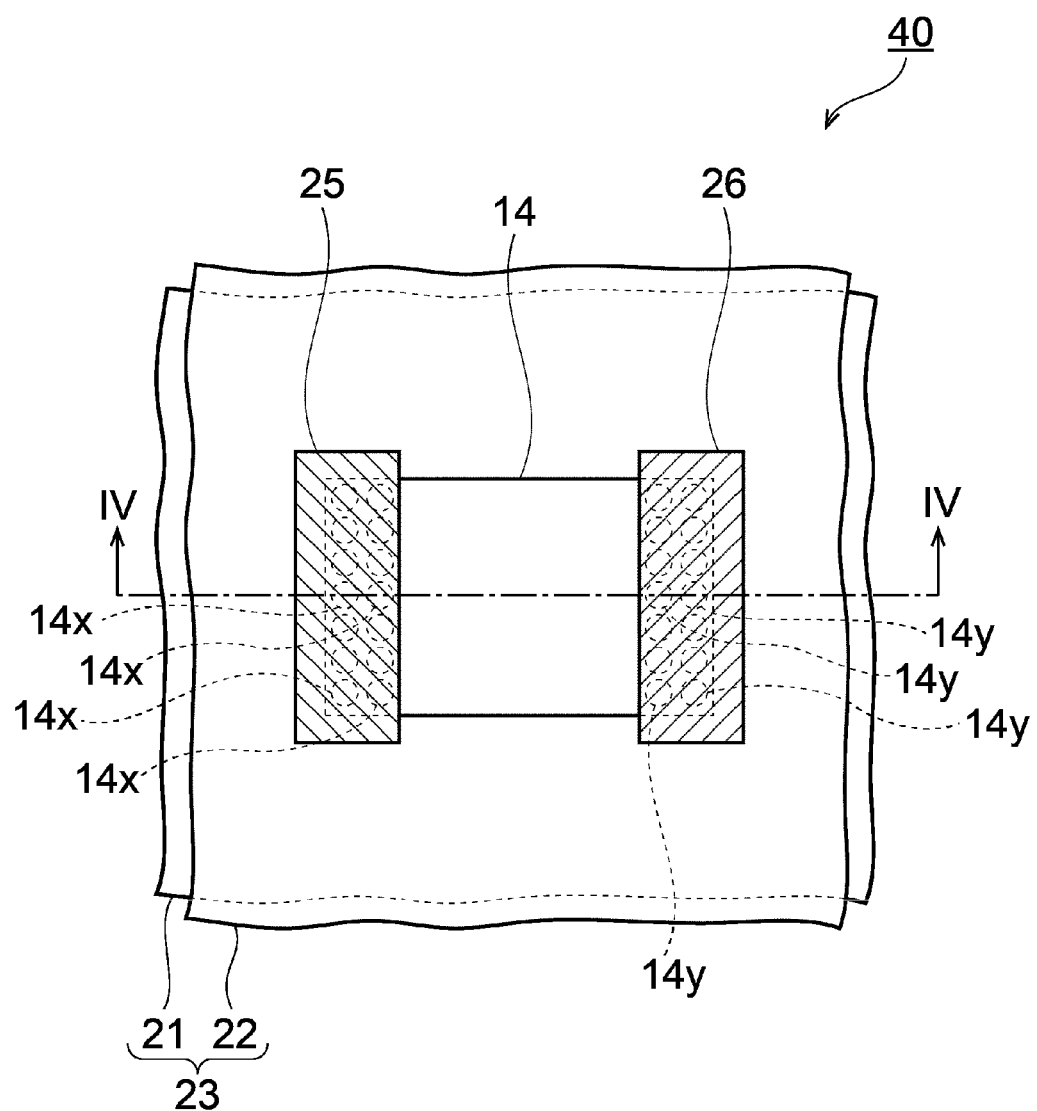
FIG. 27 is a plan view of a photo detection element in accordance with the fourth embodiment.

Then, as illustrated in FIG. 26, a resist layer (not illustrated) having an opening to which the second side surface 14b and the second holes 14y are exposed is formed. Thereafter, a platinum layer is formed across the entire upper surface of the substrate 23 by evaporation, and the resist layer is then removed to leave the platinum layer, as the second electrode 26, in the second holes 14y and on the second side surface 14b and remove the unnecessary platinum layer. Through the above-described steps, the fundamental structure of a photo detection element 40 in accordance with the fourth embodiment is completed. FIG. 27 is a plan view of the photo detection element 40, and FIG. 26 corresponds to the cross-sectional view taken along line IV-IV in FIG. 27. As illustrated in FIG. 27, the first holes 14x are arranged in a grid pattern in plan view, and the second holes 14y are arranged in a grid pattern in plan view.

In the fourth embodiment described above, the first holes 14x are formed in the light-receiving layer 14, and the first electrode 25 is formed also in the first holes 14x. Thus, the first electrode 25 is in contact with the ends 15a of the graphene layers 15 not only on the first side surface 14a but also in the first holes 14x, and the contact resistance between the first electrode 25 and the graphene layers 15 is thereby reduced.

In addition, since the first holes 14x are tapered, the material of the first electrode 25 easily adheres onto the ends 15a of the graphene layers 15. Thus, the contact resistance between the first electrode 25 and the graphene layers 15 is further reduced. Similarly, also in the second holes 14y, the contact resistance between the second electrode 26 and the graphene layers 15 is reduced.

Fifth Embodiment

In a fifth embodiment, a structure different from the structure of the fourth embodiment is employed to reduce the contact resistances between the graphene layers 15 and the electrodes 25 and 26.

Figure 28:
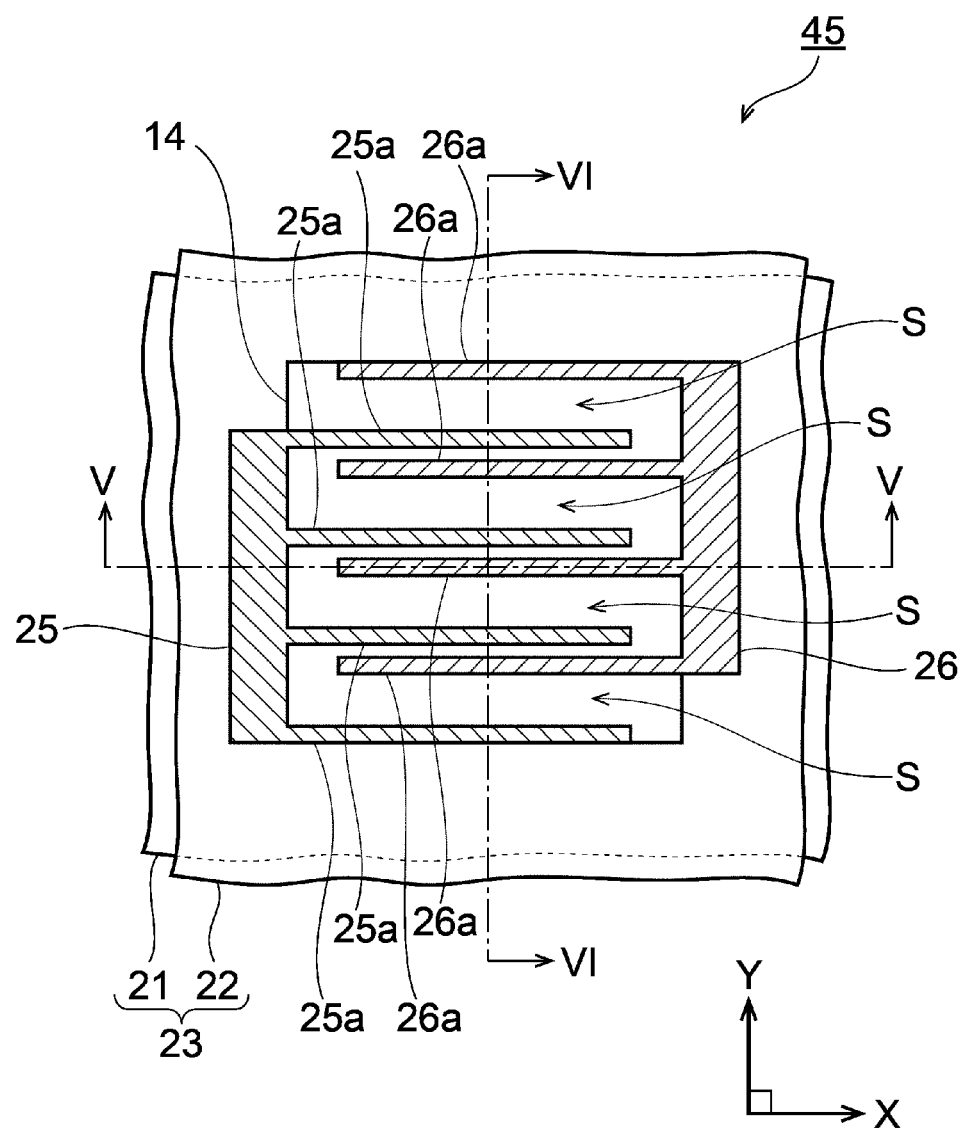
FIG. 28 is a plan view of a photo detection element in accordance with a fifth embodiment.

FIG. 28 is a plan view of a photo detection element 45 in accordance with the fifth embodiment. In FIG. 28, the same reference numerals are used for the same elements as those described in the first through fourth embodiments, and the description thereof is omitted.

Figure 29A:
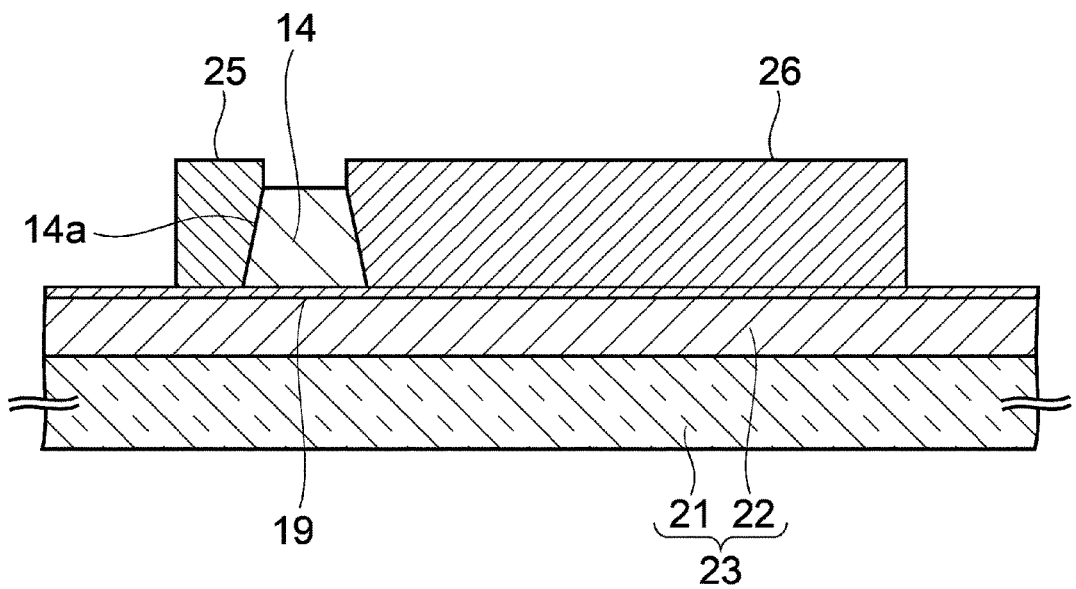
FIG. 29A is a cross-sectional view taken along line V-V in FIG. 28.
Figure 29B:
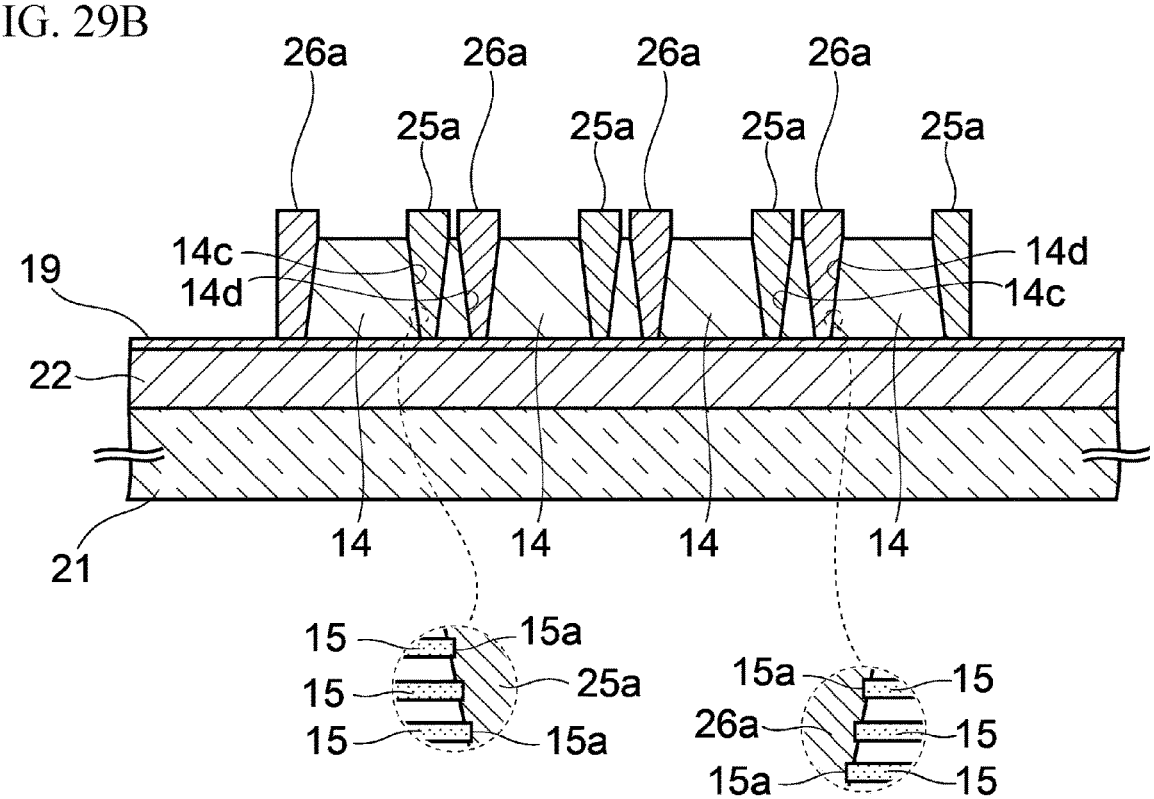
FIG. 29B is a cross-sectional view taken along line VI-VI in FIG. 28.

As illustrated in FIG. 28, the first electrode 25 in the fifth embodiment is comb-shaped in plan view, and has first teeth 25a extending in the first direction X. Similarly, the second electrode 26 is comb-shaped in plan view, and has second teeth 26a extending in the first direction X. The lengths and the widths of these teeth 25a and 26a are not particularly limited. For example, the teeth 25a and 26a may be formed to have lengths of approximately 1 µm to 100 µm in the first direction X, and the widths of the teeth 25a and 26a may be approximately 0.02 µm to 5 µm. The teeth 25a are arranged at intervals in a second direction Y intersecting with the first direction X, and the teeth 26a are located at intervals in the second direction Y. The interval between the adjacent first teeth 25a in the second direction Y is, for example, approximately 1 µm to 20 µm. The same applies to the second teeth 26a. In the example of FIG. 28, the teeth 25a and 26a are alternately arranged at unequal intervals, but the teeth 25a and 26a may be alternately arranged at equal intervals. FIG. 29A is a cross-sectional view taken along line V-V in FIG. 28, and FIG. 29B is a cross-sectional view taken along line VI-VI in FIG. 28. As illustrated in FIG. 29A, the first electrode 25 is formed on and beside the first side surface 14a of the light-receiving layer 14 as in the first embodiment.

As illustrated in FIG. 29B, first grooves 14c and second grooves 14d are formed in the light-receiving layer 14. These grooves 14c and 14d can be formed by isotropically etching parts, which are not covered with the mask layer 24, of the light-receiving layer 14 as in the step of FIG. 24B of the fourth embodiment. The first teeth 25a are embedded in the grooves 14c, and the second teeth 26a are embedded in the grooves 14d.

This structure causes the first teeth 25a to be in contact with the ends 15a of the graphene layers 15 in the first grooves 14c, thereby reducing the contact resistance between the first electrode 25 and the graphene layers 15 compared with the case where no first groove 14c is provided. Similarly, the formation of the second teeth 26a in the second grooves 14d reduces the contact resistance between the second electrode 26 and the graphene layers 15. As in the fourth embodiment, the holes 14x and 14y may be respectively provided under the electrodes 25 and 26 to further reduce the contact resistances between the electrodes 25 and 26 and the graphene layers 15.

In addition, since the electrodes 25 and 26 are comb-shaped as illustrated in FIG. 28, the space S where the light-receiving layer 14 receives a light is secured between the teeth 25a and 26a, and decrease in the light-receiving area of the light-receiving layer 14 is thereby reduced.

Sixth Embodiment

In a sixth embodiment, the output voltage output from the photo detection element is increased in the following manner.

Figure 30:
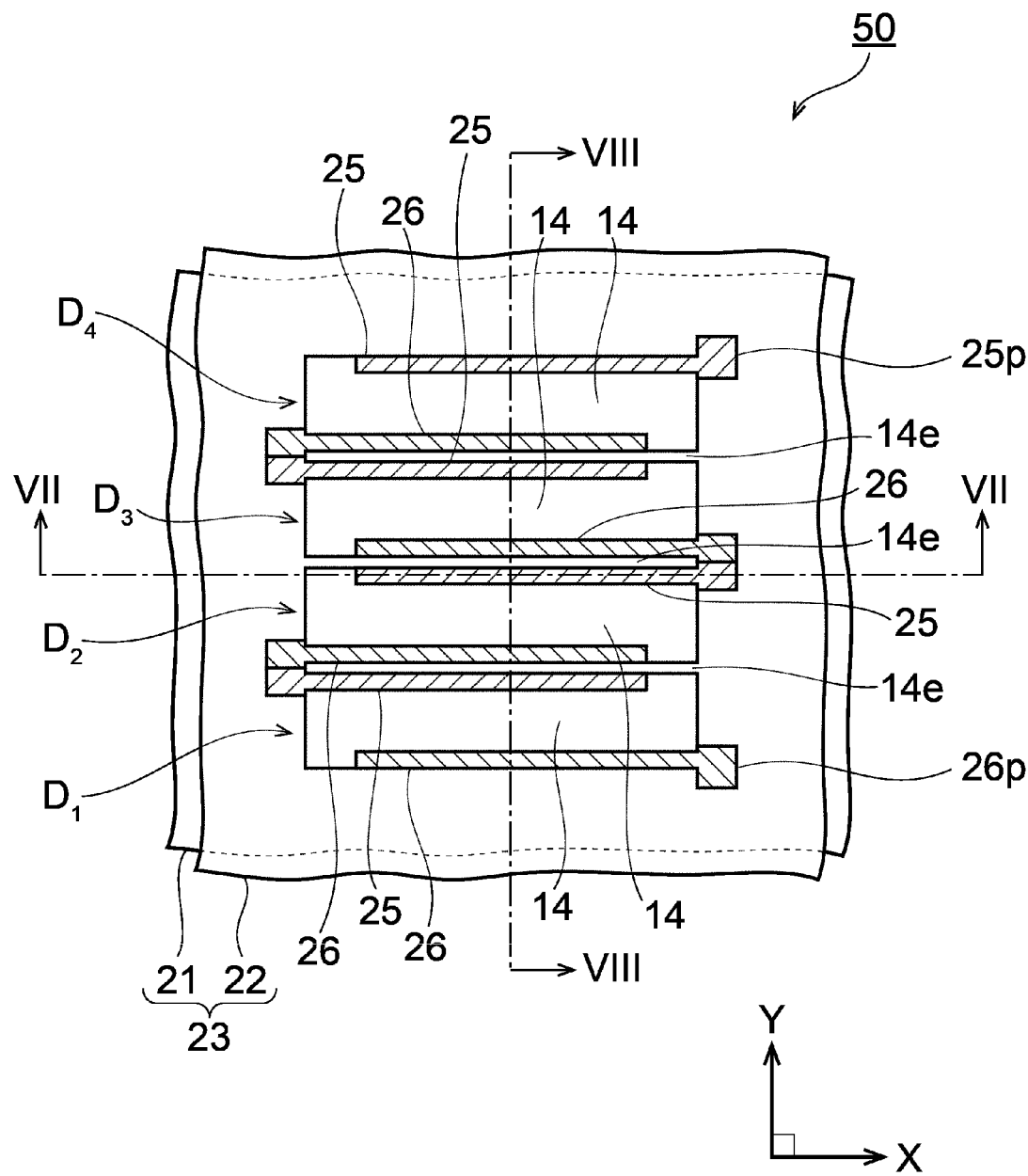
FIG. 30 is a plan view of a photo detection element in accordance with a sixth embodiment.

FIG. 30 is a plan view of a photo detection element 50 in accordance with the sixth embodiment. In FIG. 30, the same reference numerals are used for the same elements as those described in the first through fifth embodiments, and the description thereof is omitted.

As illustrated in FIG. 30, in the sixth embodiment, element separation grooves 14e extending in the first direction X are formed in the light-receiving layer 14, and the light-receiving layer 14 is separated into first through fourth light receiving sections $D_1$ through $D_4$ by the element separation grooves 14e. These light receiving sections $D_1$ through $D_4$ have rectangular shapes in plan view, and are arranged at intervals in the second direction Y intersecting with the first direction X. The element separation groove 14e has a width of approximately 0.02 µm to 5 µm.

Figure 31A:
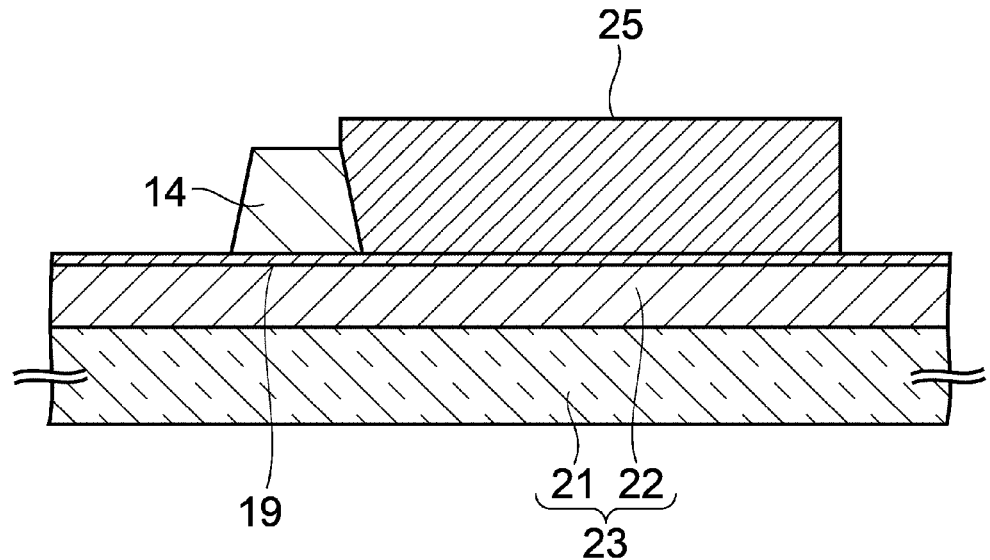
FIG. 31A is a cross-sectional view taken along line VII-VII in FIG. 30.
Figure 31B:
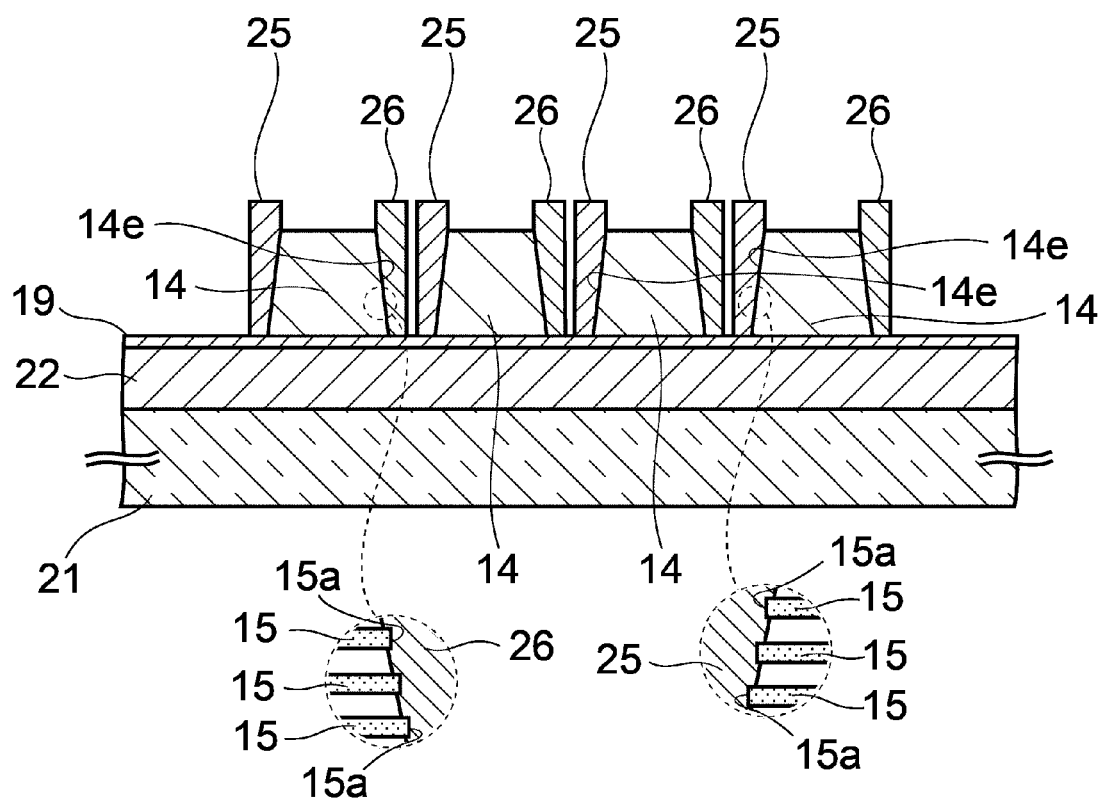
FIG. 31B is a cross-sectional view taken along line VIII-VIII in FIG. 30.

The first electrode 25 and the second electrode 26 are provided to each of the light receiving sections $D_1$ through $D_4$, and the electrodes 25 and 26 of the adjacent light receiving sections are electrically connected. An output pad 25p for extracting the output voltage of the light-receiving layer 14 is provided to the first electrode 25 at the one end, and an output pad 26p for extracting the output voltage of the light-receiving layer 14 is provided to the second electrode 26 at the other end. In the above described structure, since the light receiving sections $D_1$ through $D_4$ are connected in series, the output voltage output from the photo detection element 50 is increased. FIG. 31A is a cross-sectional view taken along line VII-VII in FIG. 30, and FIG. 31B is a cross-sectional view taken along line VIII-VIII in FIG. 30. As illustrated in FIG. 31A, the second electrode 26 is not present but the first electrode 25 is present in the cross-section taken along line VII-VII.

As illustrated in FIG. 31B, each of the electrodes 25 and 26 is formed on the side surface of the element separation groove 14e. The element separation grooves 14e can be formed by isotropically etching parts, which are not covered with the mask layer 24, of the light-receiving layer 14 as in the step of FIG. 24B of the fourth embodiment. The above-described structure allows each of the electrodes 25 and 26 to be connected to the ends 15a of the graphene layers 15 in the element separation groove 14e.

Seventh Embodiment

In a seventh embodiment, an optical sensor including the photo detection element described in any one of the first through sixth embodiments will be described.

Figure 32:
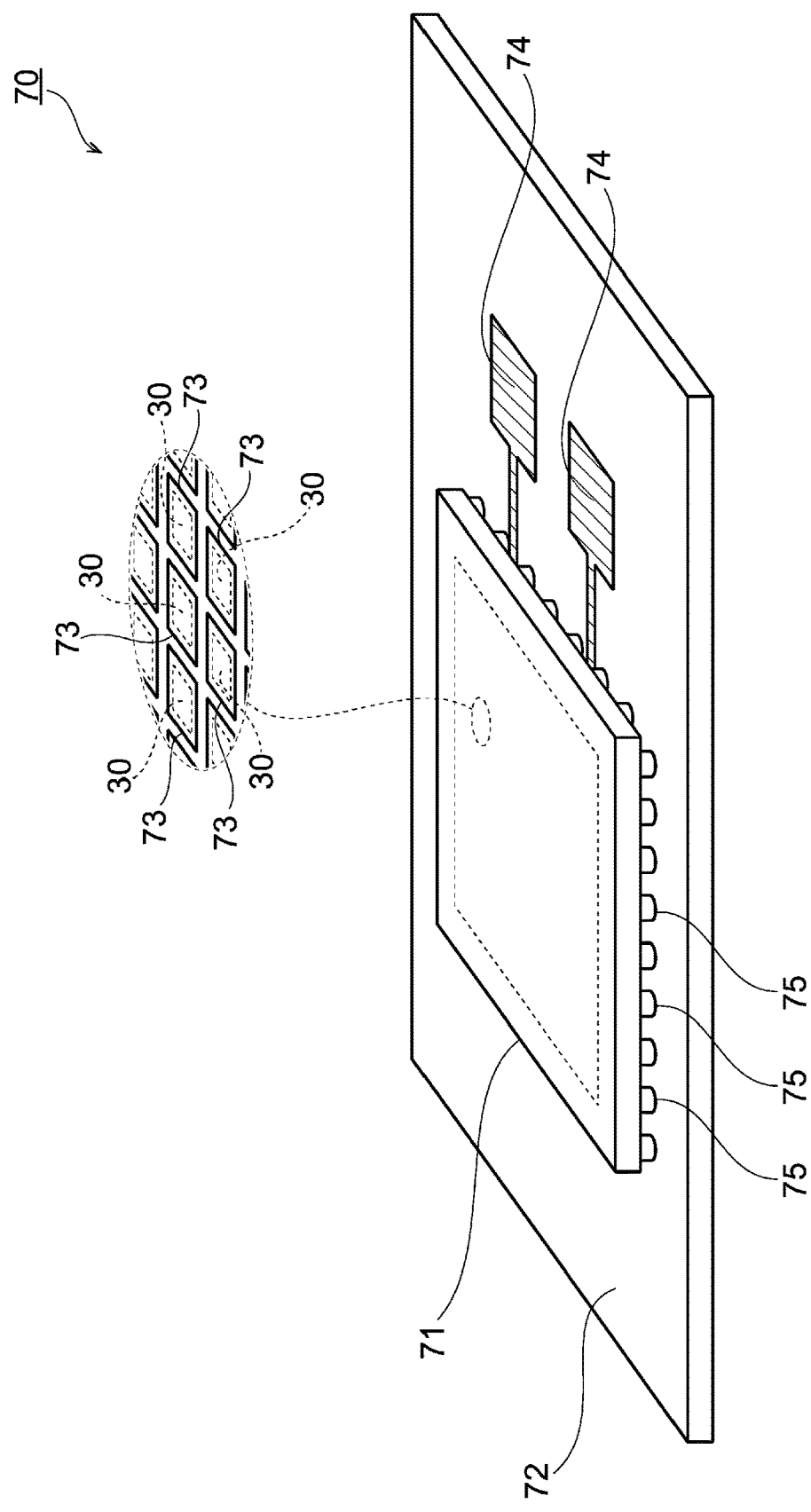
FIG. 32 is a perspective view of an optical sensor in accordance with a seventh embodiment.

FIG. 32 is a perspective view of an optical sensor in accordance with the seventh embodiment. In FIG. 32, the same reference numerals are used for the same elements as those described in the first through sixth embodiments, and the description thereof is omitted. An optical sensor 70 is an image sensor for obtaining an image, and includes an imaging element 71 and a drive element 72 that drives the imaging element 71. The imaging element 71 includes pixels 73 formed at intervals in a plane.

Figure 33:
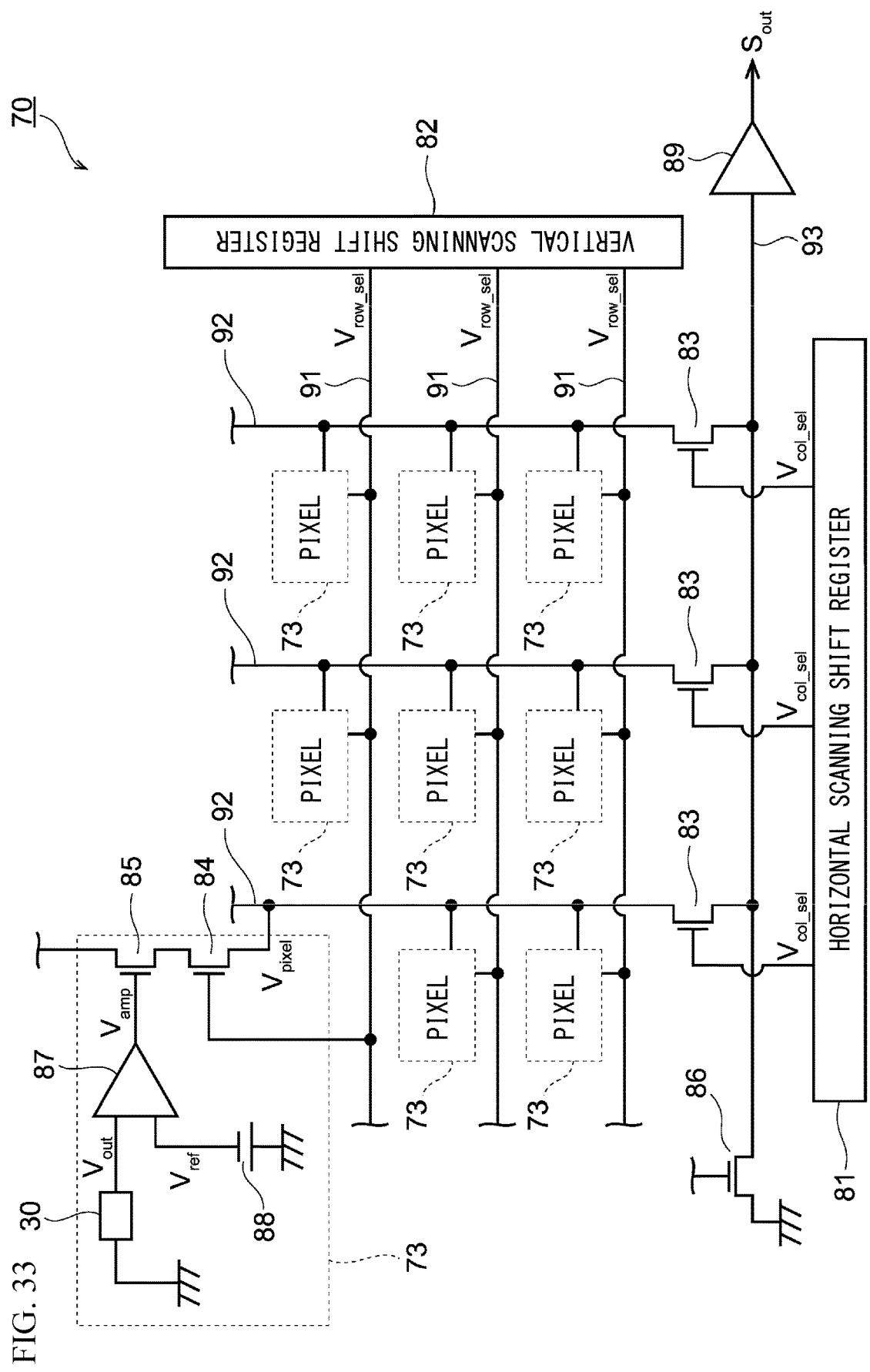
FIG. 33 is an equivalent circuit diagram of the optical sensor in accordance with the seventh embodiment.

The drive element 72 includes a silicon substrate on which transistors having complementary metal oxide semiconductor (CMOS) structures are formed. These transistors include selection transistors for selecting a certain pixel 73 including the photo detection element 30, and a transistor for an amplifier circuit such as an amplifier that amplifies the output voltage of the pixel 73. The drive element 72 is provided with pads 74 for input and output. The drive voltage for driving the imaging element 71 is input from the pad 74. The output voltage amplified by the amplifier circuit is output from the pad 74. The imaging element 71 and the drive element 72 are mechanically and electrically connected by bumps 75. FIG. 33 is an equivalent circuit diagram of the optical sensor 70.

As illustrated in FIG. 33, the optical sensor 70 includes a horizontal scanning shift register 81, a vertical scanning shift register 82, column selection transistors 83, a source follower current setting transistor 86, and an output amplifier 89.

The horizontal scanning shift register 81 applies a column selection voltage $V_{col\_sel}$ to one of the column selection transistors 83 to cause the selected column selection transistor 83 to be in the on state.

The vertical scanning shift register 82 applies a row selection voltage $V_{now\_sel}$ to one of address lines 91. This causes a row selection transistor 84 of the pixels 73 connected to the address line 91 to which the row selection voltage $V_{row\_sel}$ is applied to be in the on state. The pixel 73 includes the photo detection element 30, the row selection transistor 84, an amplifier transistor 85, an input amplifier 87, and a power source 88. Instead of the photo detection element 30 of the first embodiment, the photo detection element of any one of the second through fifth embodiments may be used.

When a light enters the photo detection element 30, the output voltage $V_{out}$ corresponding to the intensity of the light is output from the photo detection element 30 to the input amplifier 87. The voltage of the power source 88 is input to the input amplifier 87 as a reference voltage $V_{ref}$, and an amplified voltage $V_{amp}$ obtained by amplifying the voltage difference between the reference voltage $V_{ref}$ and the output voltage $V_{out}$ is output from the input amplifier 87.

The value of the reference voltage $V_{ref}$ is not particularly limited. For example, the value of the reference voltage $V_{ref}$ is appropriately adjusted according to the average output voltage of the photo detection element so that the amplified voltage $V_{amp}$ is suitable for the circuits in latter stages.

The amplified voltage $V_{amp}$ is applied to the gate of the amplifier transistor 85. The amplifier transistor 85 functions as a source follower amplifier, and the voltage corresponding to the amplified voltage $V_{amp}$ is output to the source of the amplifier transistor 85.

The row selection transistor 84 is connected to the source of the amplifier transistor 85, and when the row selection transistor 84 is in the on state, a pixel voltage $V_{pixel}$ with a magnitude corresponding to the amplified voltage $V_{amp}$ is output to a vertical bus line 92.

As described above, in the optical sensor 70, the pixel voltage $V_{pixel}$ is extracted from one pixel 73 selected by the horizontal scanning shift register 81 and the vertical scanning shift register 82.

Then, the pixel voltage $V_{pixel}$ is output to a horizontal bus line 93 in sequence by switching the pixel 73 to be selected with time. The amount of current through the horizontal bus line 93 is set by the source follower current setting transistor 86. These pixel voltages $V_{pixel}$ are input to the output amplifier 89 through the horizontal bus line 93. The output amplifier 89 amplifies each pixel voltage $V_{pixel}$, and outputs an image signal with an analog value to the outside.

Figure 34:
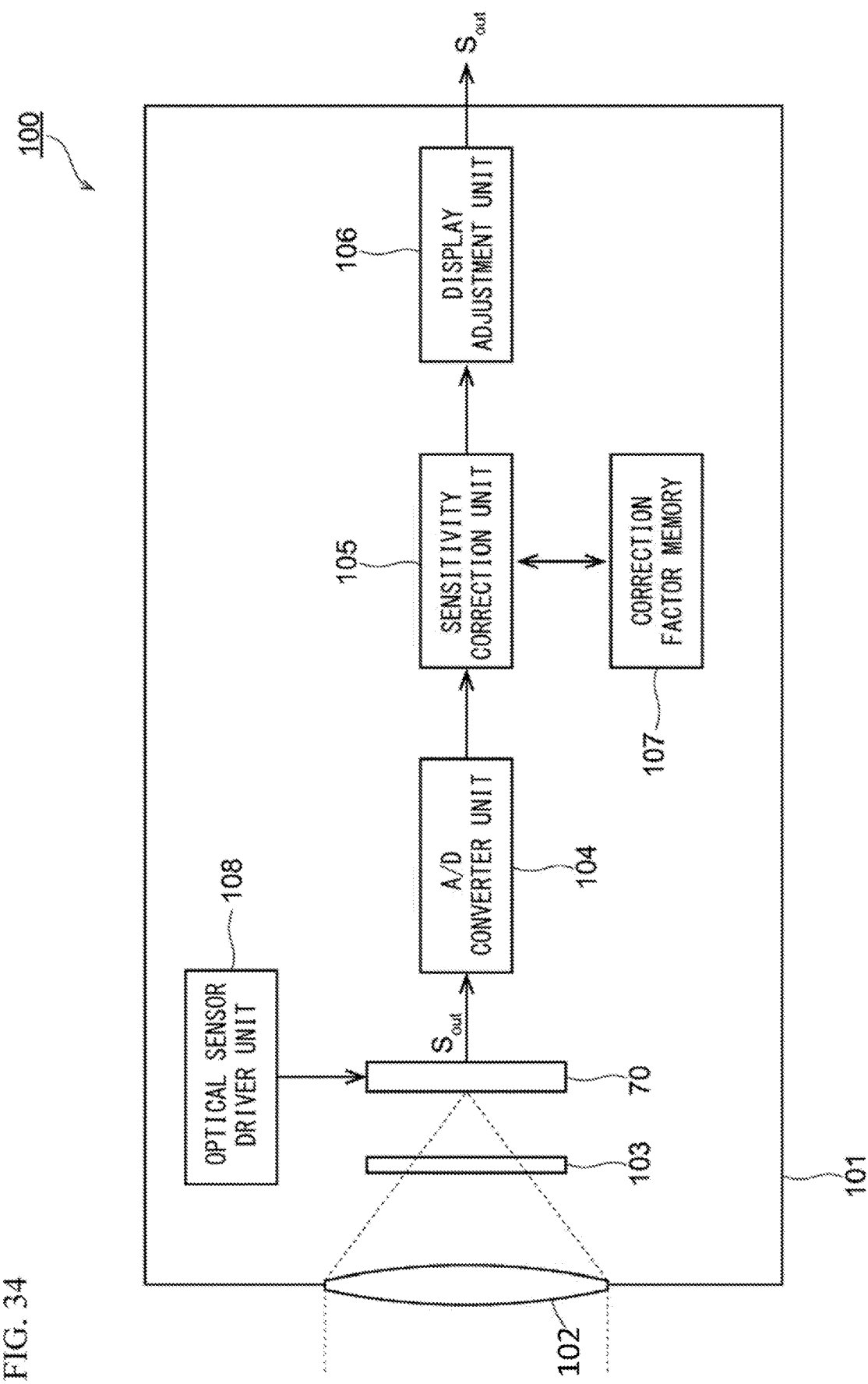
FIG. 34 is a block diagram of an imaging device in accordance with the seventh embodiment.

The optical sensor 70 described above allows an image to be obtained even when a light is weak because the sensitivity of the photo detection element 30 is increased by the graphene layers 15 of which the lattices are randomly displaced from each other as described in the first embodiment. Next, an imaging device including the optical sensor 70 will be described. FIG. 34 is a block diagram of an imaging device 100 in accordance with the present embodiment.

As illustrated in FIG. 34, the imaging device 100 includes a chassis 101 housing the optical sensor 70. An imaging lens 102, a filter 103, an A/D converter unit 104, a sensitivity correction unit 105, a display adjustment unit 106, a correction factor memory 107, and an optical sensor driver unit 108 are provided in the chassis 101. In this example, the photo detection elements 30 of the optical sensor 70 are positioned in the focal point of the imaging lens 102. The output from the imaging element 71 is extracted by the drive element 72 described above while the optical sensor 70 is controlled by the optical sensor driver unit 108.

The filter 103 is an infrared transmitting filter that allows infrared lights with a wavelength of, for example, 1000 nm or greater to pass therethrough, and is located between the imaging lens 102 and the optical sensor 70. The filter 103 causes the optical sensor 70 to obtain an infrared image. The A/D converter unit 104 converts an image signal $S_{out}$ output from the optical sensor 70 into a digital signal, and outputs the digital signal to the sensitivity correction unit 105.

The sensitivity correction unit 105 is a circuit that corrects the image signal $S_{out}$ in consideration of variation in the sensitivities of the pixels 73. In this example, the correction factor for correcting the sensitivity of each pixel 73 is stored in the correction factor memory 107 in advance. The sensitivity correction unit 105 refers to the correction factor memory 107 to correct the image signal $S_{out}$.

The corrected image signal $S_{out}$ is input to the display adjustment unit 106. The display adjustment unit 106 is a circuit that adjusts the gain and offset of the image signal $S_{out}$ to optimize the contrast of the image, and the final image signal $S_{out}$ after adjustment is output to the outside.

The imaging device described above can obtain an infrared image even when the infrared lights emitted from the imaging object is weak because the sensitivity of the photo detection element 30 in the optical sensor 70 is increased as described above.

All examples and conditional language recited herein are intended for pedagogical purposes to aid the reader in understanding the invention and the concepts contributed by the inventors to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various change, substitutions, and alterations could be made hereto without departing from the spirit and scope of the invention.

What is claimed is:

1. A photo detection element comprising:
    a substrate;
    a light-receiving layer formed over the substrate, the light-receiving layer including graphene layers that are stacked such that lattices of the graphene layers are randomly displaced from each other in plan view;
    a first electrode that is in contact with the light-receiving layer; and
    a second electrode that is in contact with the light-receiving layer, a material of the second electrode differing from a material of the first electrode.

2. The photo detection element according to claim 1, wherein
    a band curve of the light-receiving layer is linear at a K point in a reciprocal lattice space.

3. The photo detection element according to claim 1, wherein
    an underlying layer containing any one of hexagonal boron nitride and diamond-like carbon is formed over the substrate, and
    the light-receiving layer is formed over the underlying layer.

4. The photo detection element according to claim 1, wherein a recessed portion is formed in a surface of the substrate under the light-receiving layer.

5. The photo detection element according to claim 1, wherein
    a hexagonal boron nitride layer is formed over an upper surface of the light-receiving layer.

6. The photo detection element according to claim 1, wherein
the light-receiving layer has a first side surface and a second side surface, the first side surface being inclined with respect to a normal direction of the substrate, the second side surface being inclined with respect to the normal direction, and
the first electrode is formed over the first side surface, and the second electrode is formed over the second side surface.

7. The photo detection element according to claim 1, wherein
the light-receiving layer includes a first region and a second region,
first holes are formed in the light-receiving layer in the first region,
second holes are formed in the light-receiving layer in the second region,
the first electrode is formed in the first holes, and
the second electrode is formed in the second holes.

8. The photo detection element according to claim 7, wherein
each of the first holes has a tapered shape in cross-sectional view, and each of the second holes has a tapered shape in cross-sectional view.

9. The photo detection element according to claim 1, wherein
first grooves and second grooves are formed in the light-receiving layer,
the first electrode is comb-shaped, the first electrode including first teeth embedded in the first grooves, and
the second electrode is comb-shaped, the second electrode including second teeth embedded in the second grooves.

10. The photo detection element according to claim 1, wherein
the light-receiving layer is separated into a first light receiving section and a second light receiving section by an element separation groove,
the first electrode and the second electrode are provided to each of the first light receiving section and the second light receiving section, and
the first electrode of the first light receiving section is electrically connected to the second electrode of the second light receiving section.

11. A method of manufacturing a photo detection element, comprising:
forming, over a substrate, a light-receiving layer including graphene layers that are stacked such that lattices of the graphene layers are randomly displaced from each other in plan view;
forming a first electrode that is in contact with the light-receiving layer; and
forming a second electrode such that the second electrode is in contact with the light-receiving layer, a material of the second electrode differing from a material of the first electrode.

12. The method according to claim 11, wherein a band curve of the light-receiving layer is linear at a K point in a reciprocal lattice space.

13. The method according to claim 11, wherein
the forming of the light-receiving layer includes transferring, to the substrate at one time, the graphene layers formed over a first supporting layer such that the lattices of the graphene layers are randomly displaced from each other in plan view.

14. The method according to claim 11, wherein
the forming of the light-receiving layer includes transferring a graphene monoatomic layer formed over a second supporting layer to the substrate one layer by one layer while positions of the substrate and the second supporting layer are randomly displaced from each other.

15. The method according to claim 11, further comprising forming a recessed portion in a surface of the substrate under the light-receiving layer.

16. The method according to claim 11, further comprising forming an underlying layer containing any one of hexagonal boron nitride and diamond-like carbon over the substrate before the forming of the light-receiving layer.

17. The method according to claim 16, wherein
the forming of the underlying layer includes transferring the underlying layer formed over a third supporting layer to the substrate while heating the substrate.

18. An optical sensor comprising:
pixels formed at intervals in a plane, each of the pixels outputting an output voltage corresponding to an intensity of an incident light; and
an amplifier circuit configured to amplify the output voltage, wherein
each of the pixels includes:
a substrate;
a light-receiving layer formed over the substrate, the light-receiving layer including graphene layers that are stacked such that lattices of the graphene layers are randomly displaced from each other in plan view;
a first electrode that is in contact with the light-receiving layer; and
a second electrode that is in contact with the light-receiving layer, a material of the second electrode differing from a material of the first electrode.

* * * * *